United States Patent [19]
Gal

[11] Patent Number: 5,497,269
[45] Date of Patent: Mar. 5, 1996

[54] DISPERSIVE MICROLENS

[75] Inventor: George Gal, Palo Alto, Calif.

[73] Assignee: Lockheed Missiles and Space Company, Inc., Sunnyvale, Calif.

[21] Appl. No.: 904,316

[22] Filed: Jun. 25, 1992

[51] Int. Cl.[6] ............................................. G02B 5/04
[52] U.S. Cl. ..................... 359/615; 359/565; 359/566; 359/619; 359/625; 359/742
[58] Field of Search ................................. 359/625, 626, 359/619, 741, 742, 743, 628, 615, 565, 566, 569, 570, 571; 356/328

[56] References Cited

U.S. PATENT DOCUMENTS

| | | | |
|---|---|---|---|
| 3,932,184 | 1/1976 | Cohen et al. | 96/38.3 |
| 4,200,794 | 4/1980 | Newberry et al. | 250/396 ML |
| 4,279,690 | 7/1981 | Dierschke | 156/649 |
| 4,421,398 | 12/1983 | Suzuki et al. | 354/200 |
| 4,427,265 | 1/1984 | Suzuki et al. | 350/321 |
| 4,611,124 | 9/1986 | Schneider | 359/619 |
| 4,691,993 | 9/1987 | Porter et al. | 350/105 |
| 4,769,750 | 9/1988 | Matsumoto et al. | 359/628 |
| 4,775,967 | 10/1988 | Shimada et al. | 369/45 |
| 4,798,448 | 1/1989 | van Raalte | 359/41 |
| 4,861,140 | 8/1989 | Lucitte et al. | 350/320 |
| 4,877,717 | 10/1989 | Suzuki et al. | 430/321 |
| 4,983,040 | 1/1991 | Chu et al. | 356/338 |
| 4,986,633 | 1/1991 | Ohta | 350/167 |
| 5,073,041 | 12/1991 | Ralstani | 385/33 |
| 5,136,164 | 8/1992 | Hendrick, Jr. | 250/353 |
| 5,139,609 | 8/1992 | Fields et al. | 156/643 |
| 5,168,401 | 12/1992 | Endriz | 359/625 |

OTHER PUBLICATIONS

William Goltsos & Michael Holz "Agile Beam Steering Using Binary Optics Microlens Arrays" Nov. 1990, *Optical Engineering*, vol. 29, No. 11.

G. Artzner: "Aspherical surfaces engraved on photoresist coatings: manufacture of a zonal corrector plate for an aberrating cassegrainian telescope", 1987, *Optical Components and Systems*, SPIE vol. 805.

E. Hausmann & E. P. Slack, Physics, (3rd Edition, 1948) at 727–728.

Primary Examiner—Georgia Y. Epps
Assistant Examiner—Michael A. Papalas
Attorney, Agent, or Firm—Feix & Feix

[57] ABSTRACT

Dispersive microlens apparatus and methods are used in one mode for detecting multiple, different wavelengths from a bandwidth of wavelengths (existing within an image plane blur spot) and are used in another mode for combining a plurality of different, emitted wavelengths into a bandwave of wavelengths (at a blur spot in an image plane).

43 Claims, 25 Drawing Sheets

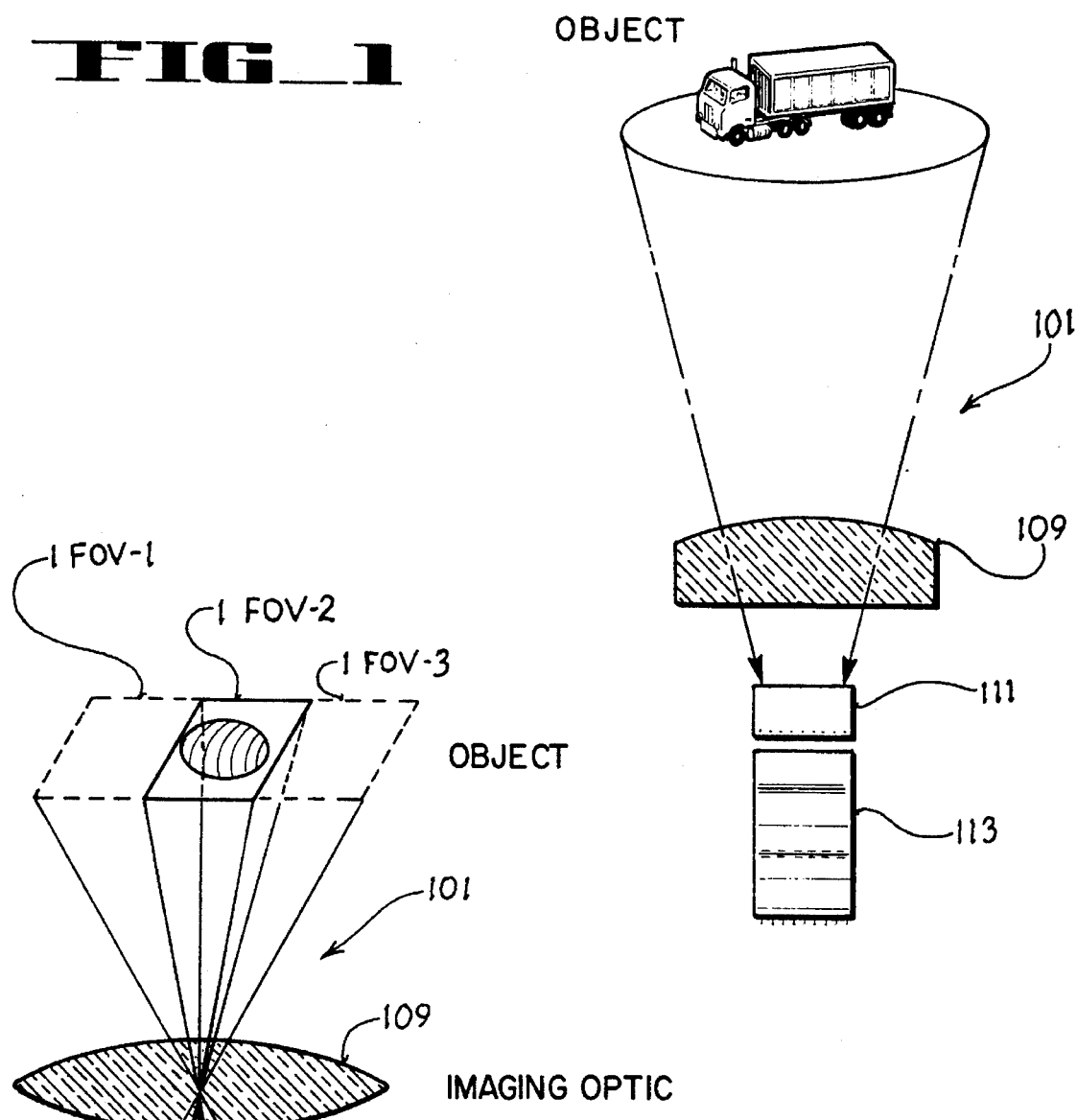
FIG_1
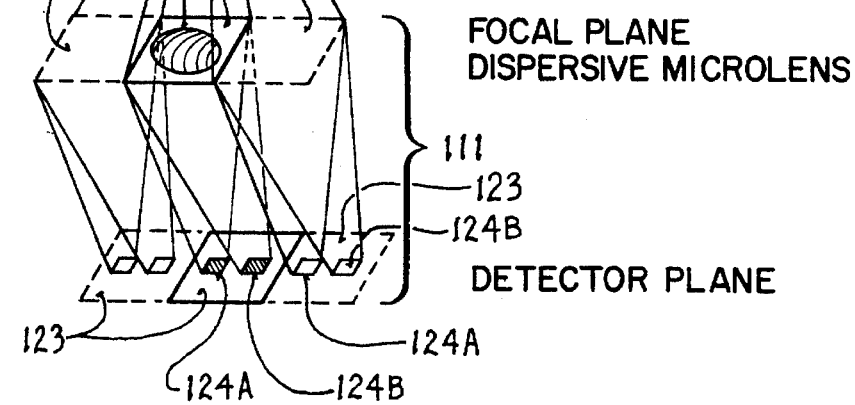
FIG_2

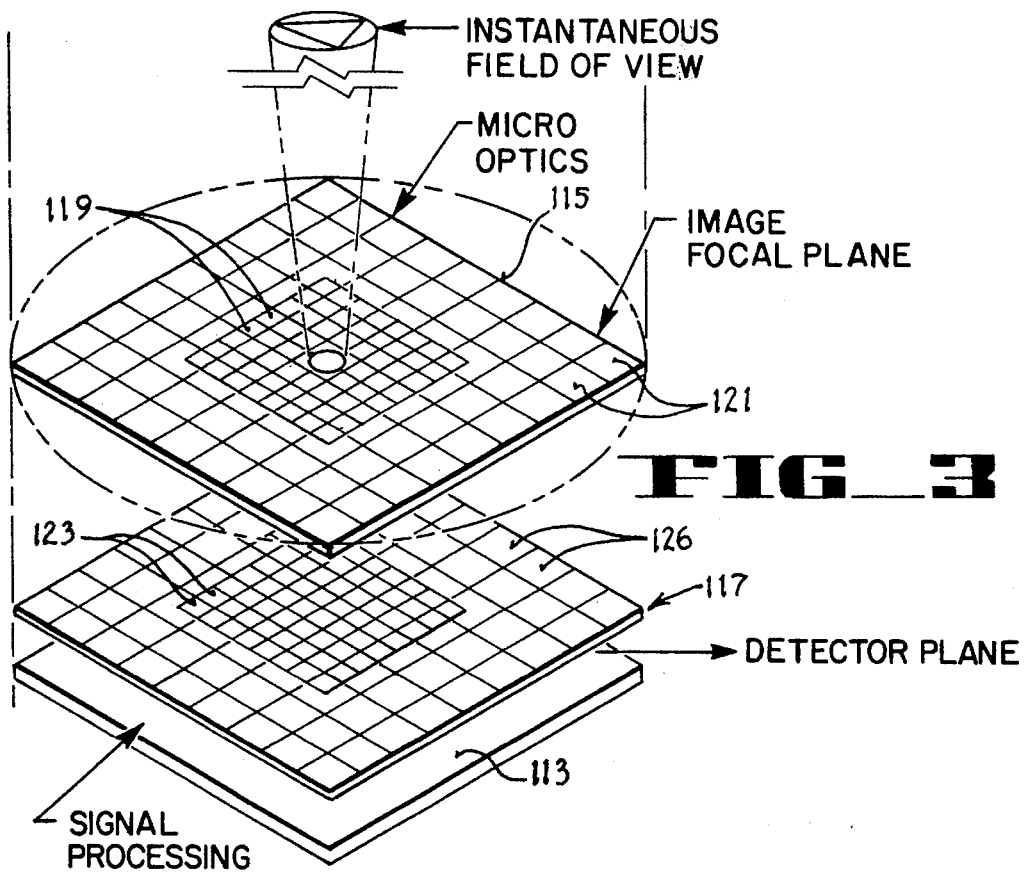
FIG_3
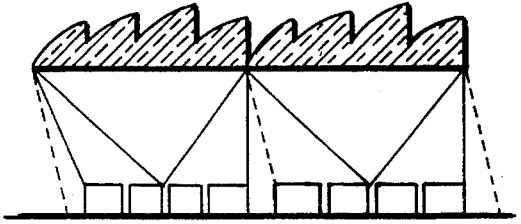
FIG_4A
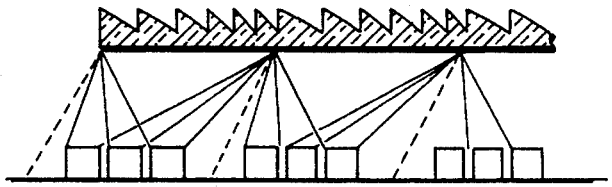
FIG_4B
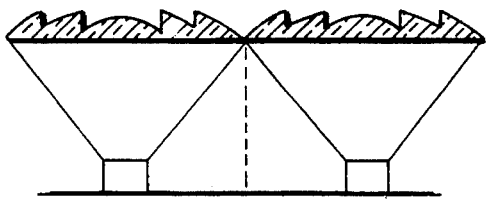
FIG_4C

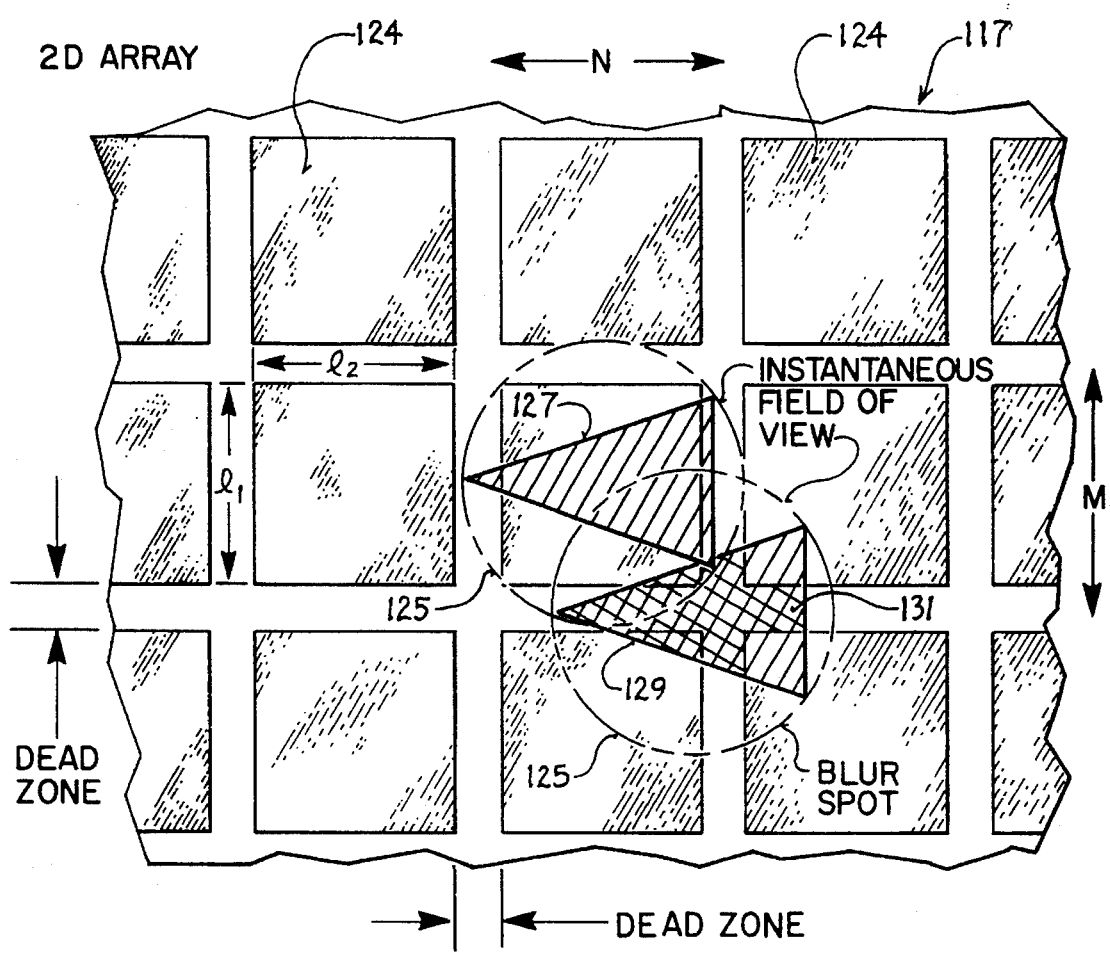
FIG_5

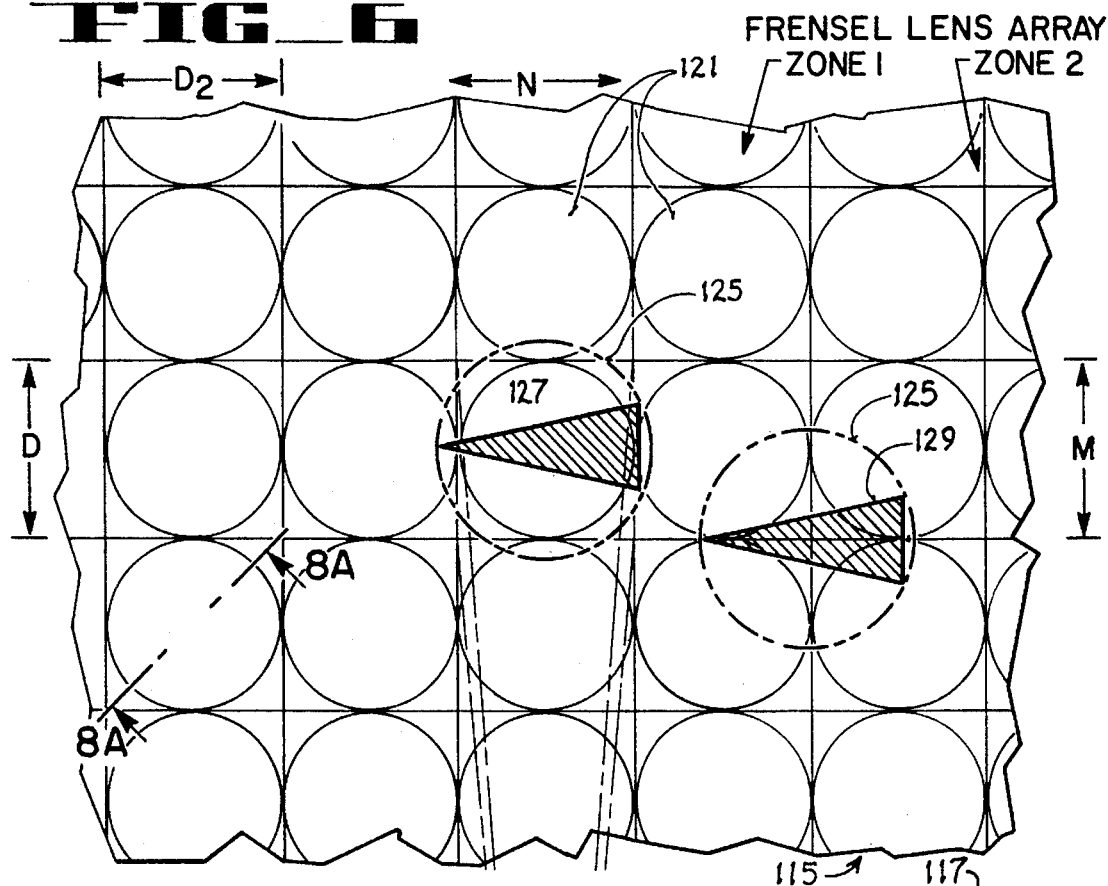
FIG_6
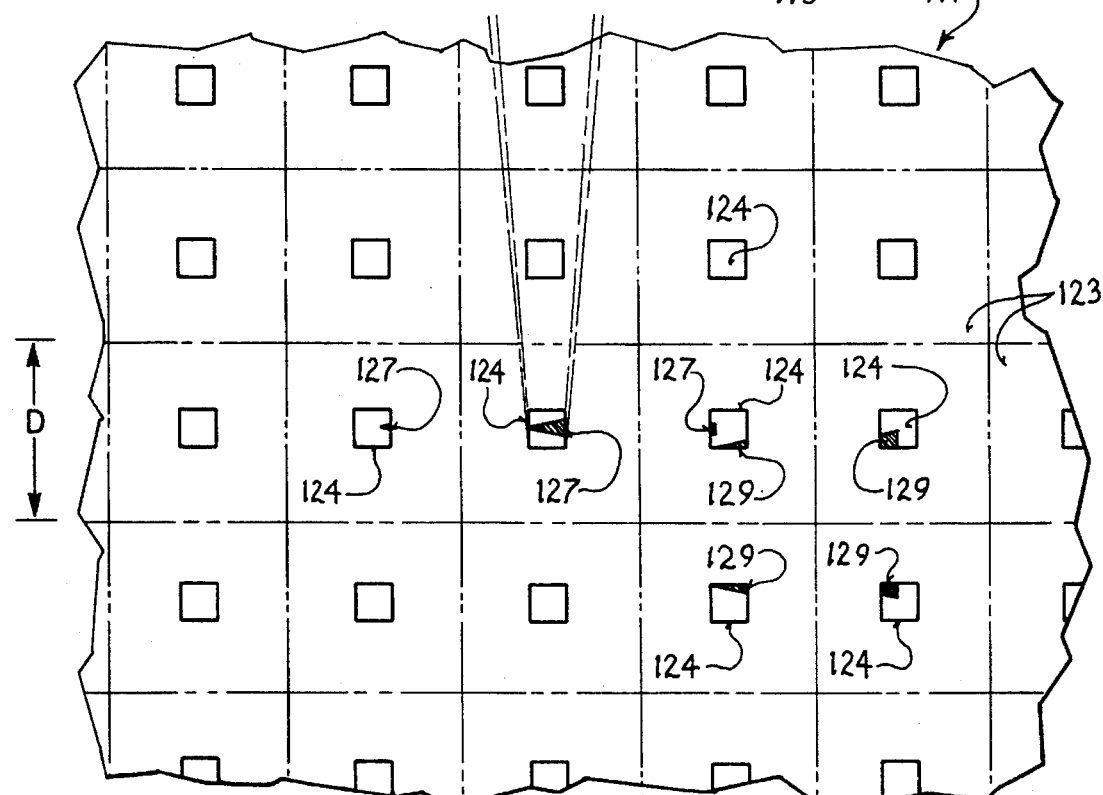
FIG_7

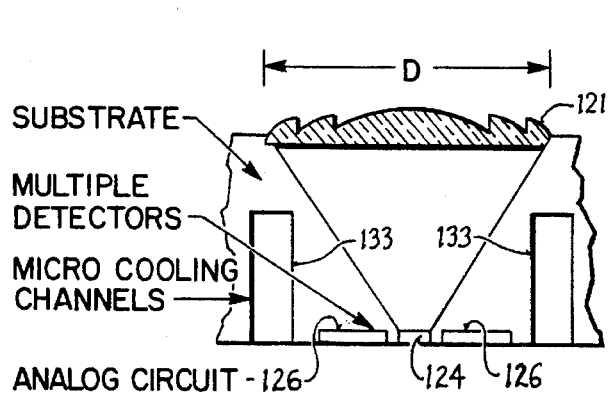
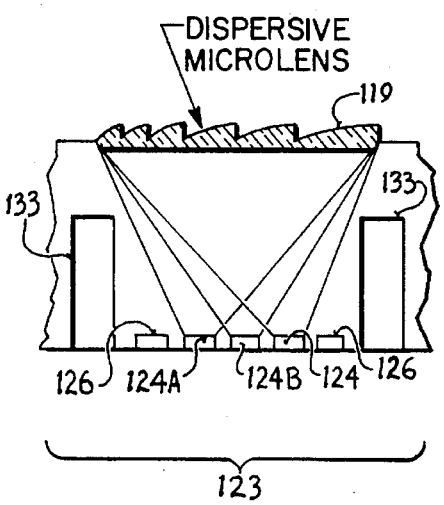
MICROLENS UTILIZATION ON FOCAL PLANES
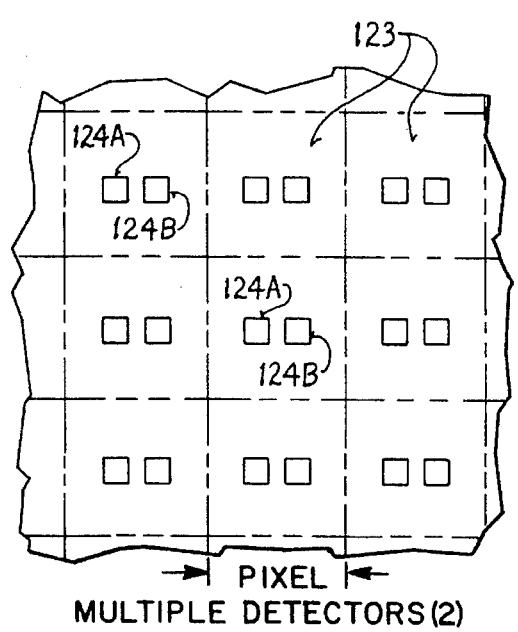
MULTIPLE DETECTORS (2)
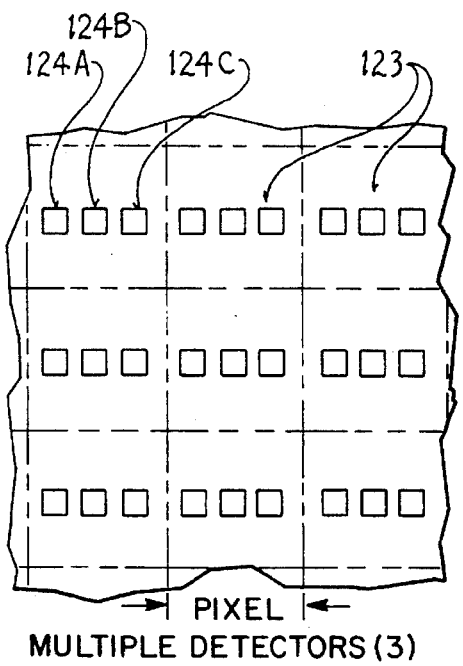
MULTIPLE DETECTORS (3)

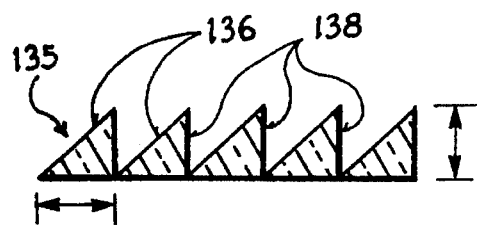
FIG_11
FIG_14
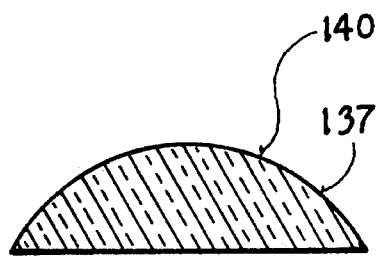
FIG_12
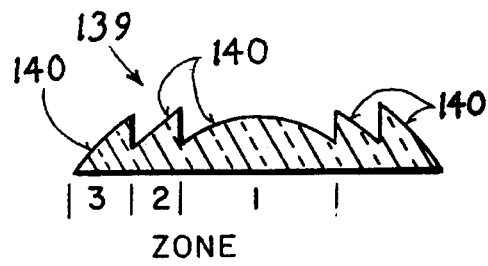
FIG_15
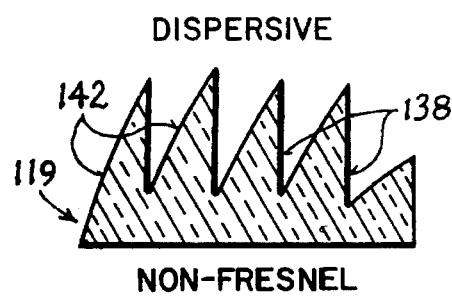
DISPERSIVE
NON-FRESNEL
FIG_13
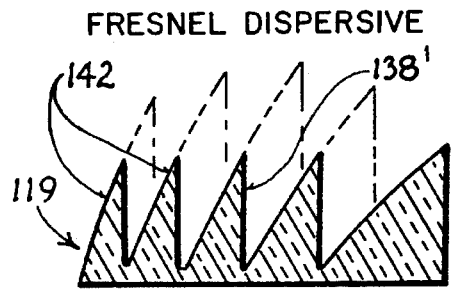
FRESNEL DISPERSIVE
FIG_16

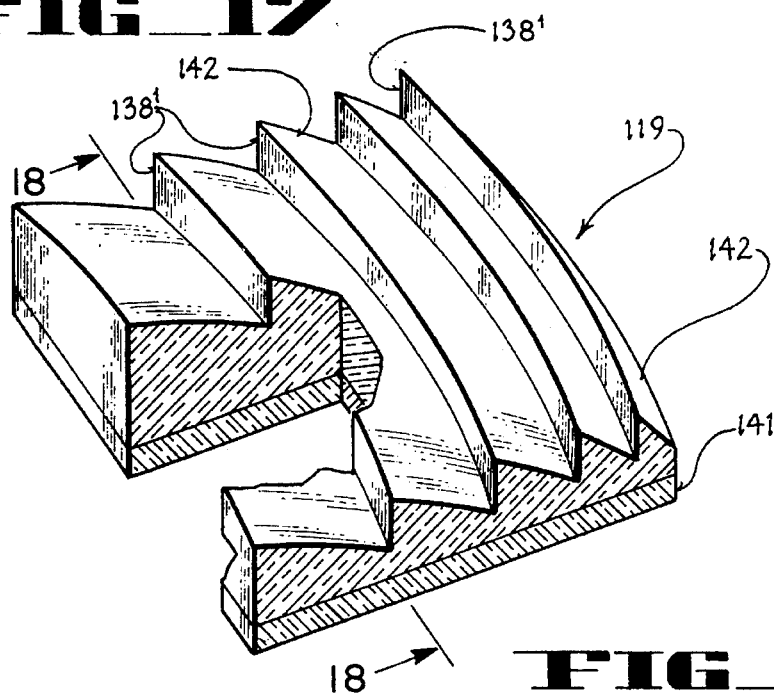
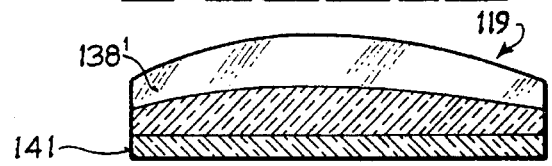
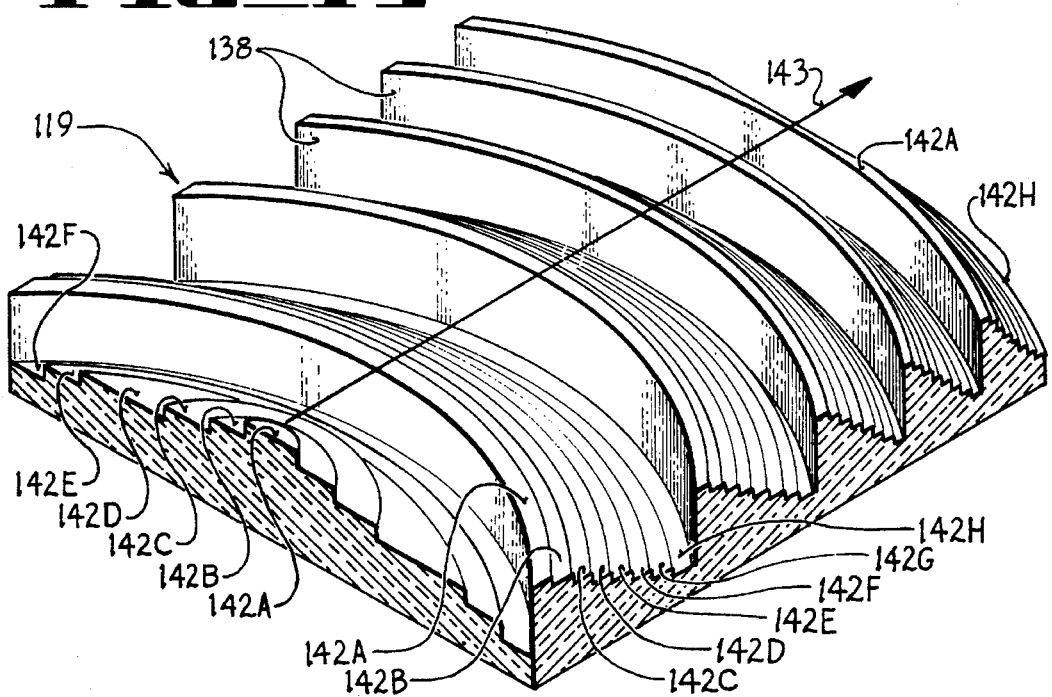

FIG_20
DISPERSIVE
NON-FRESNEL
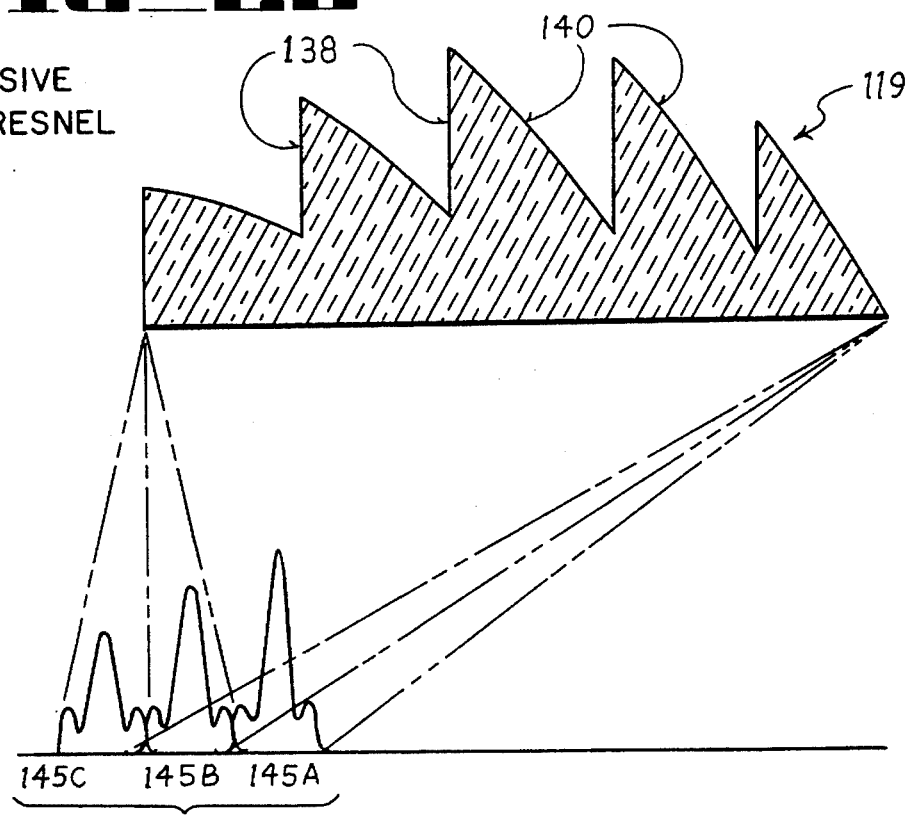
FIG_21
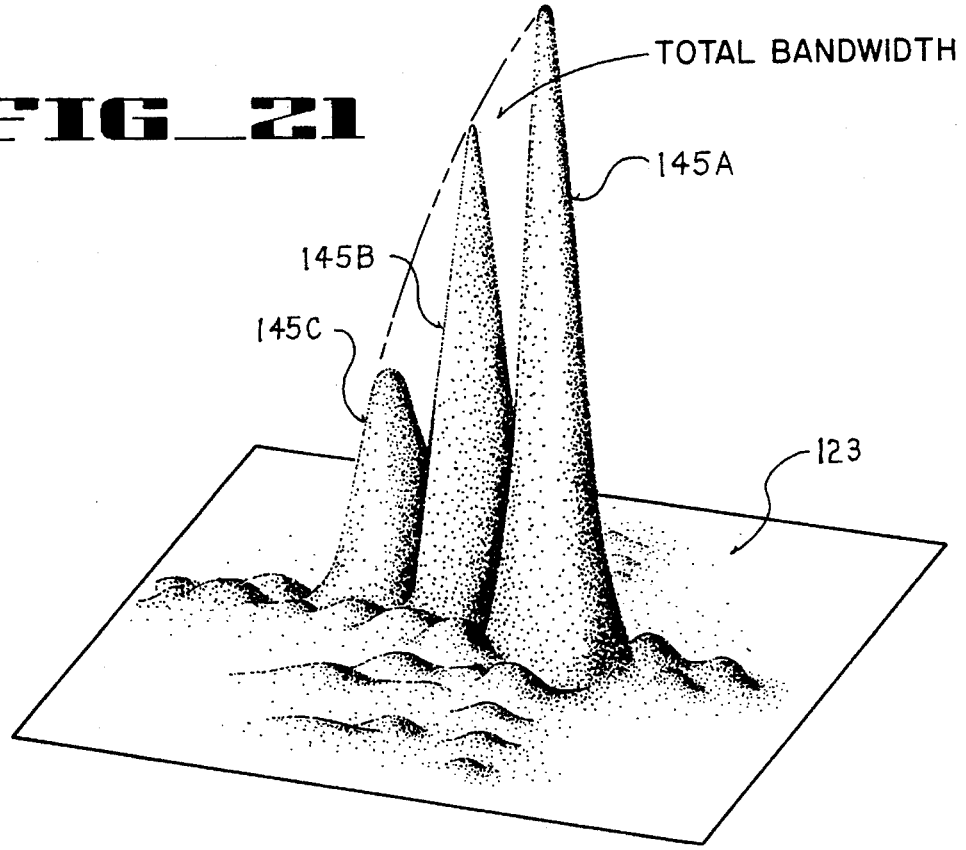

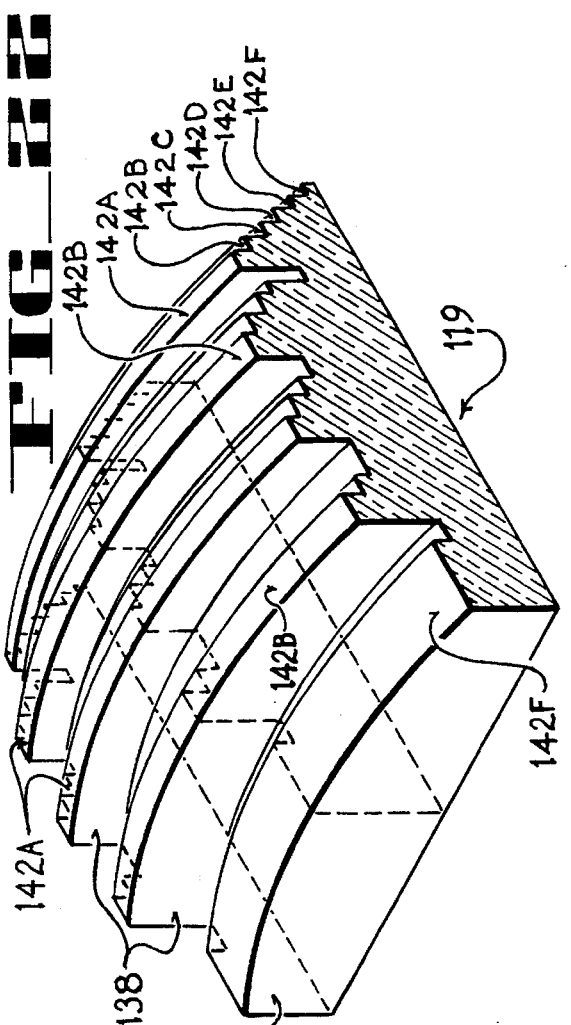
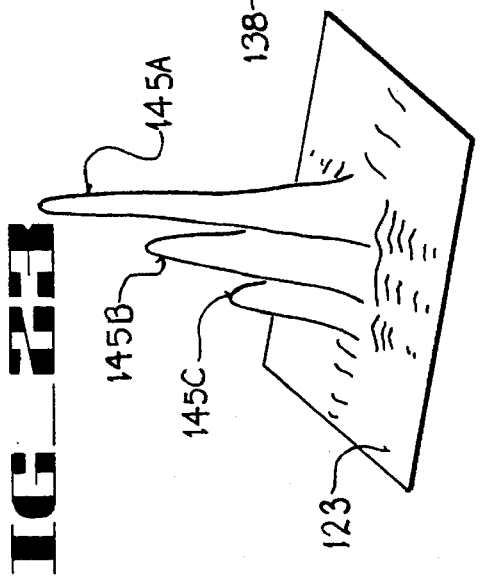
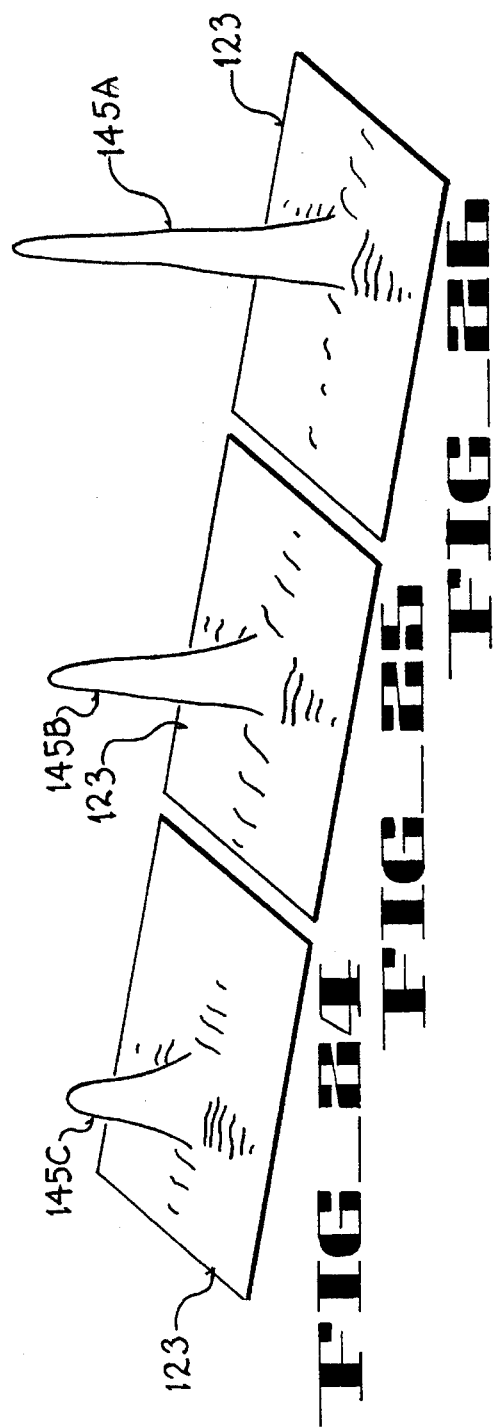

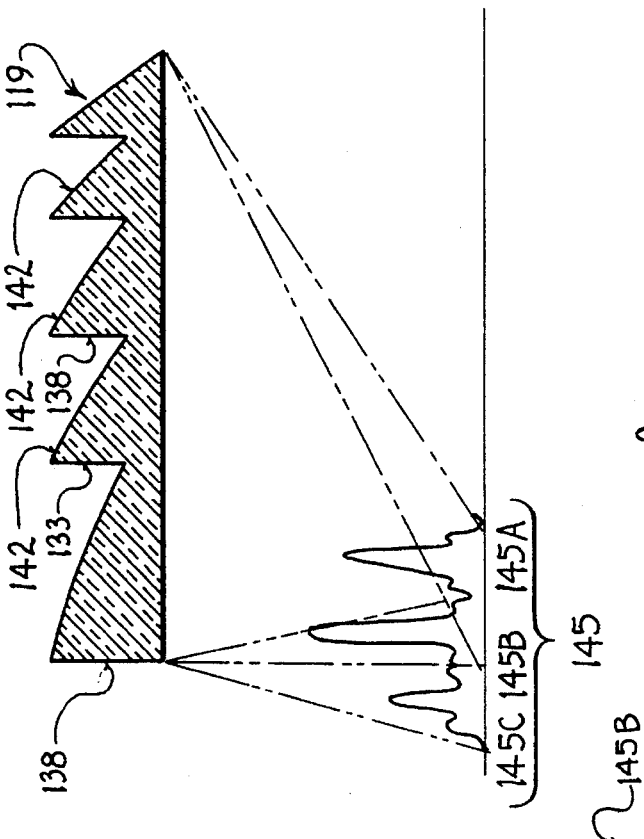
FIG_27
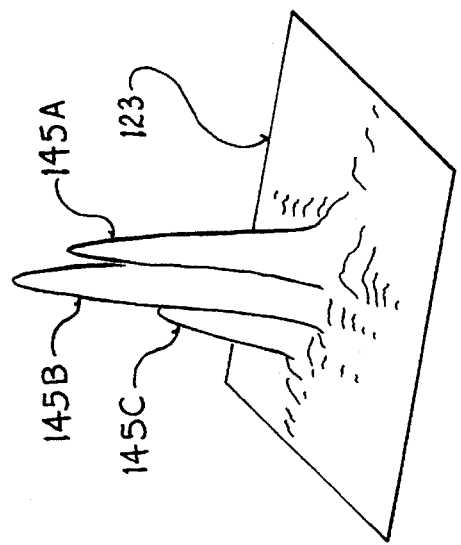
FIG_28
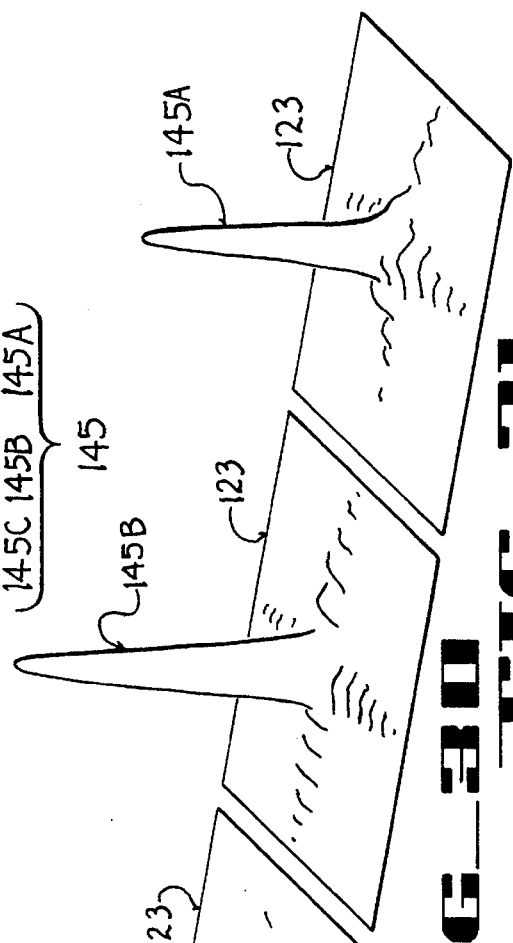
FIG_30  FIG_31
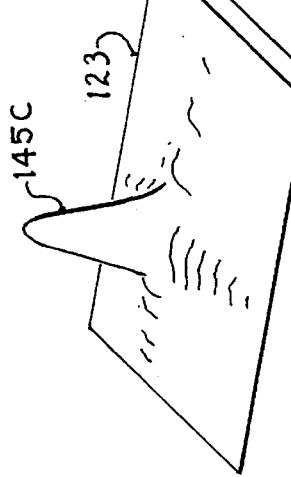
FIG_29

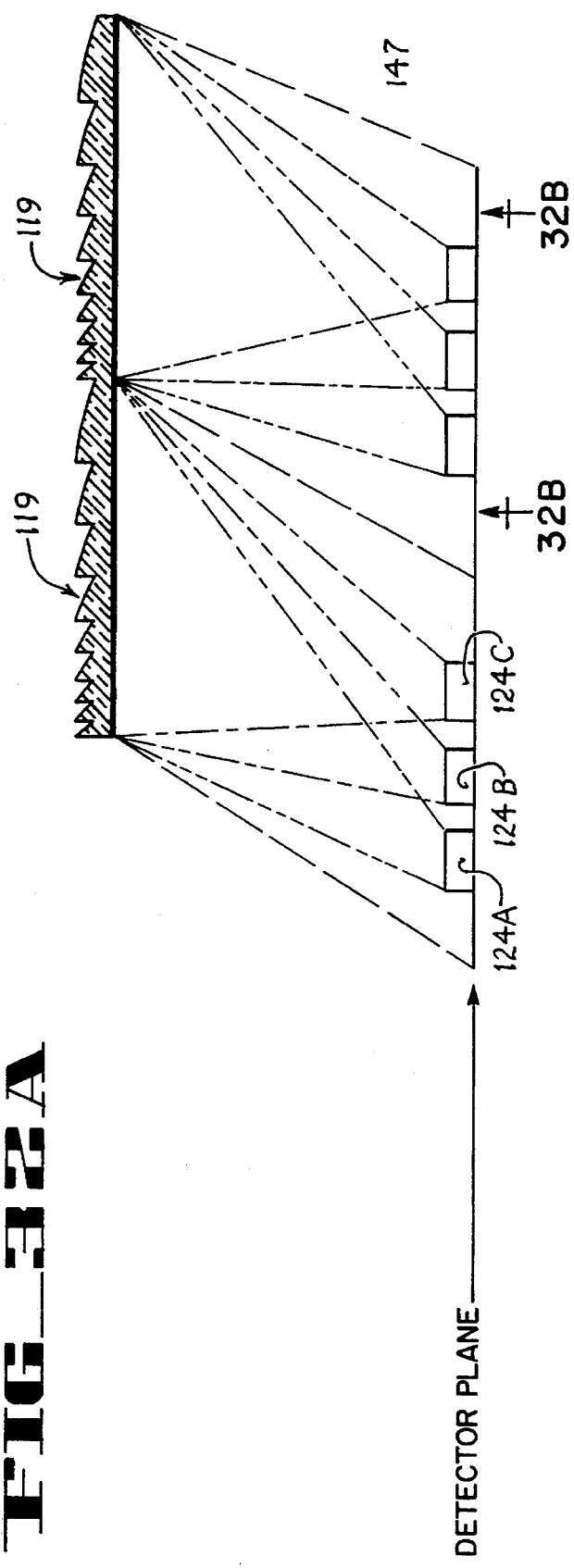
FIG_32A
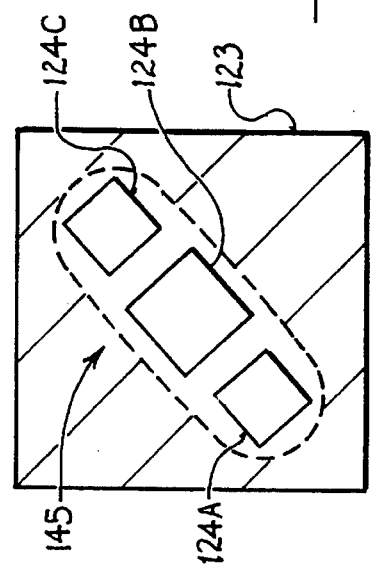
FIG_32B
DISPERSIVE FRESNEL MICROLENS

FIG_33
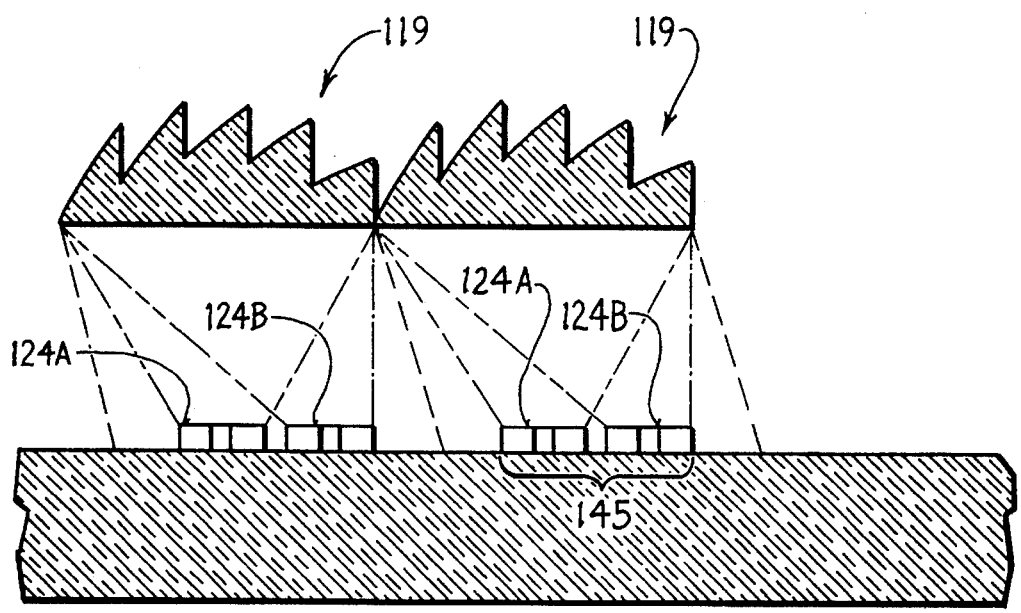
FIG_34A  FIG_34B
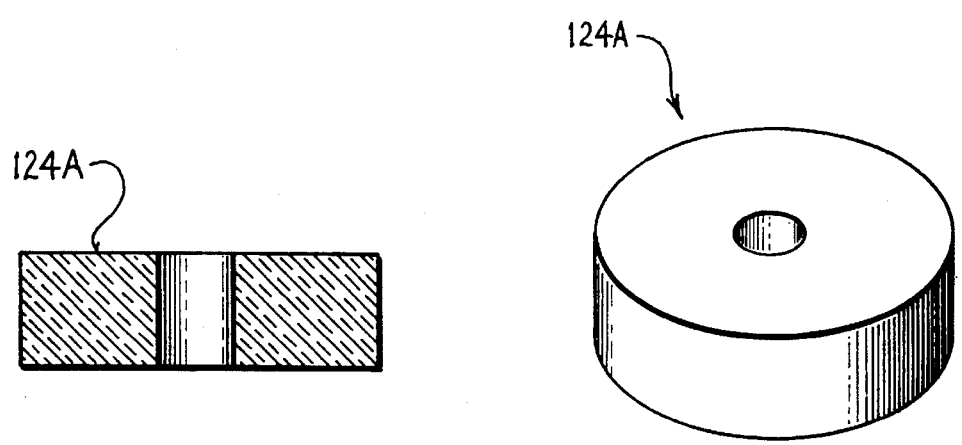

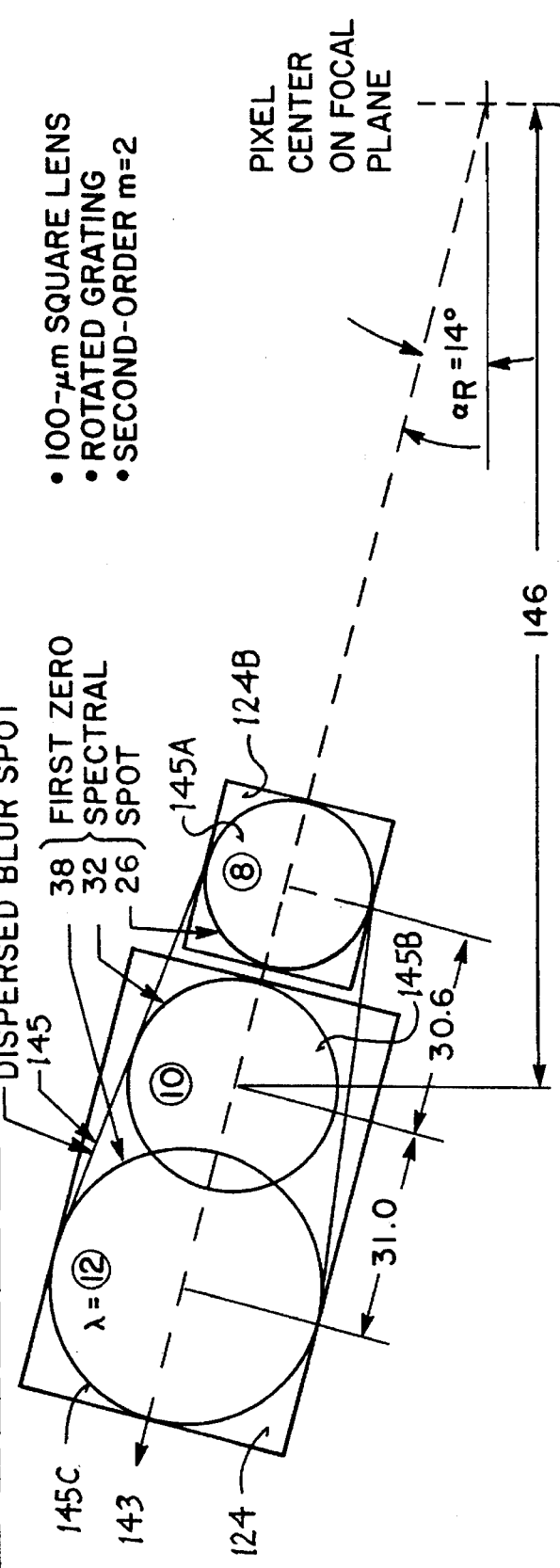
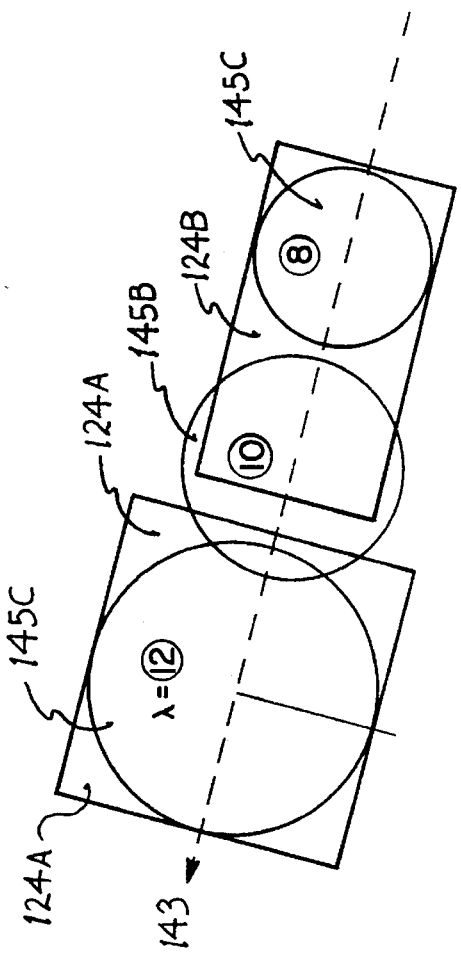
FIG._35
FIG._36

FIG_37
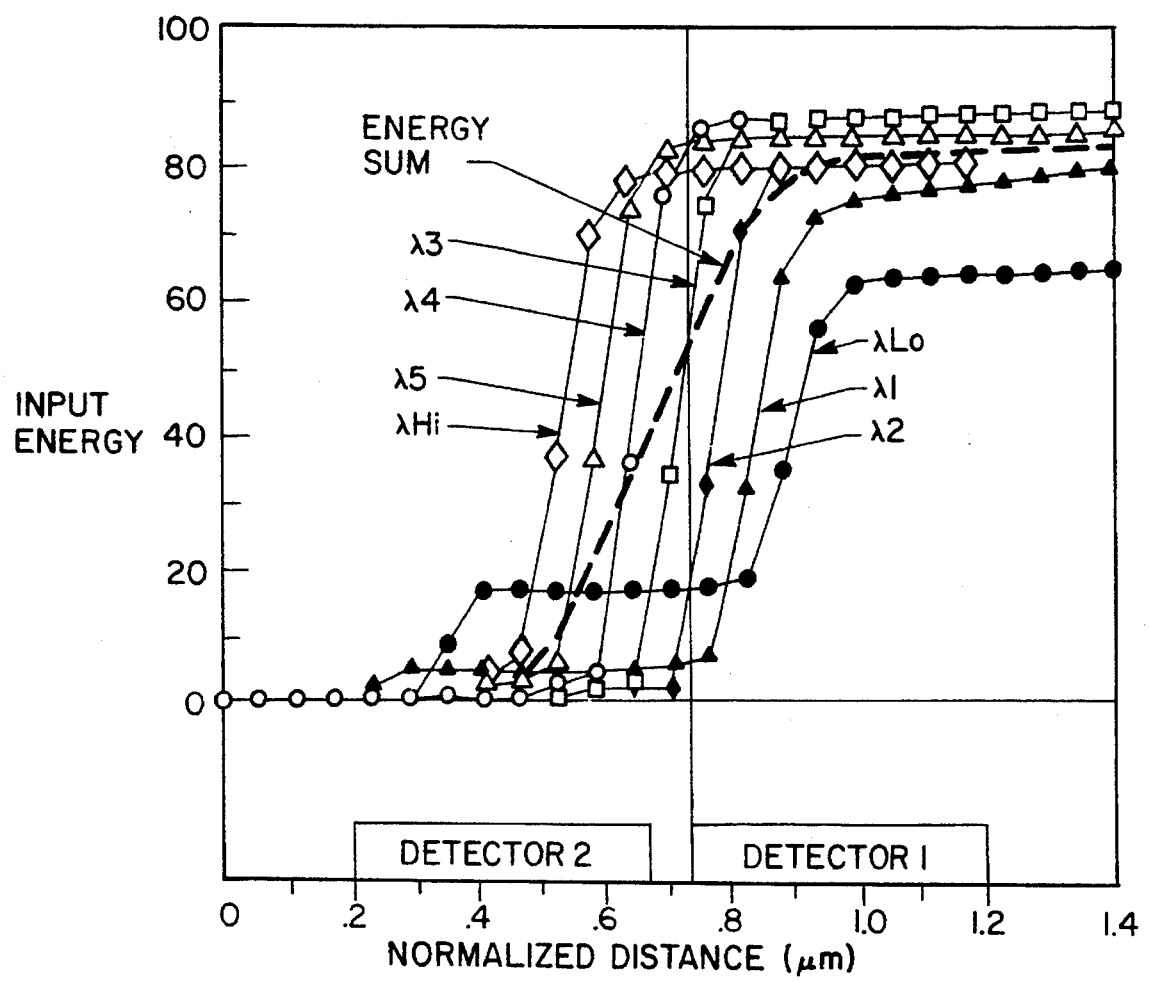

FIG_38
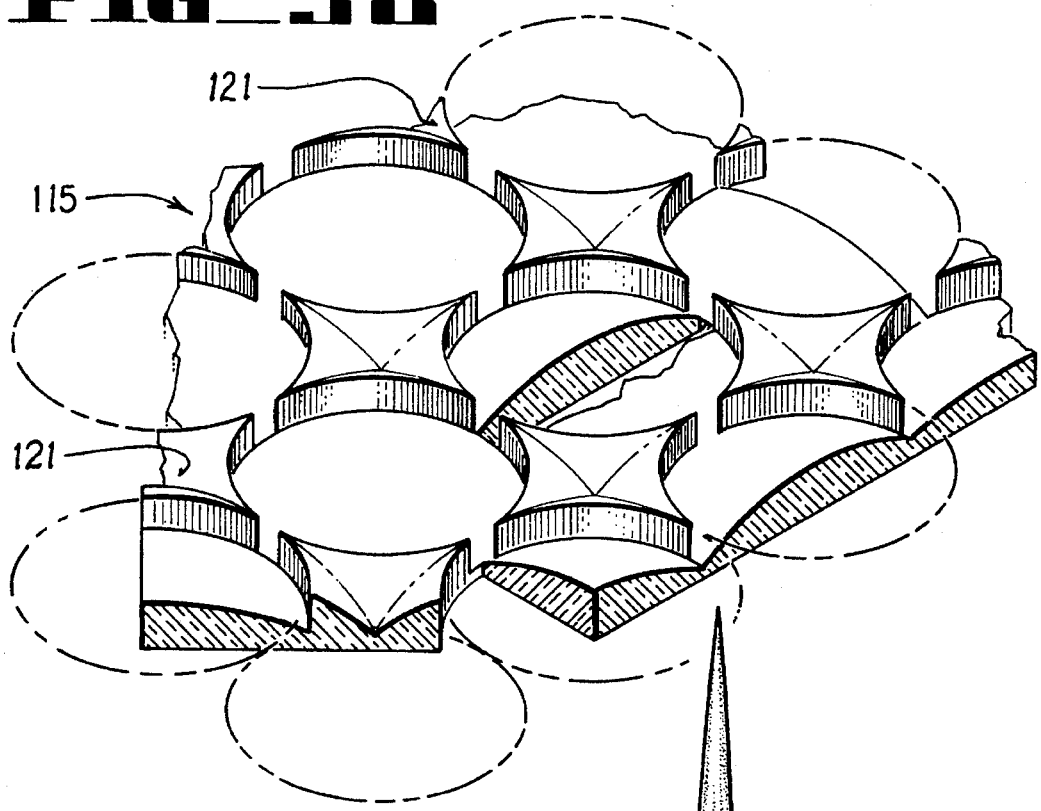
2 ZONE FRESNEL NONBINARY
FIG_39
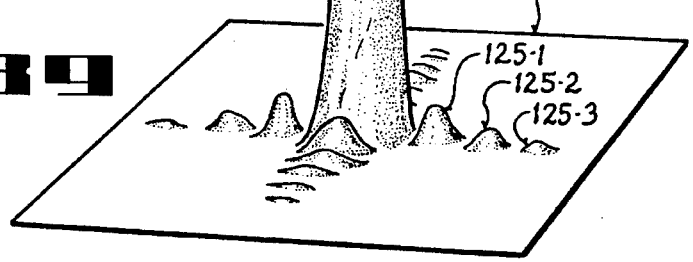

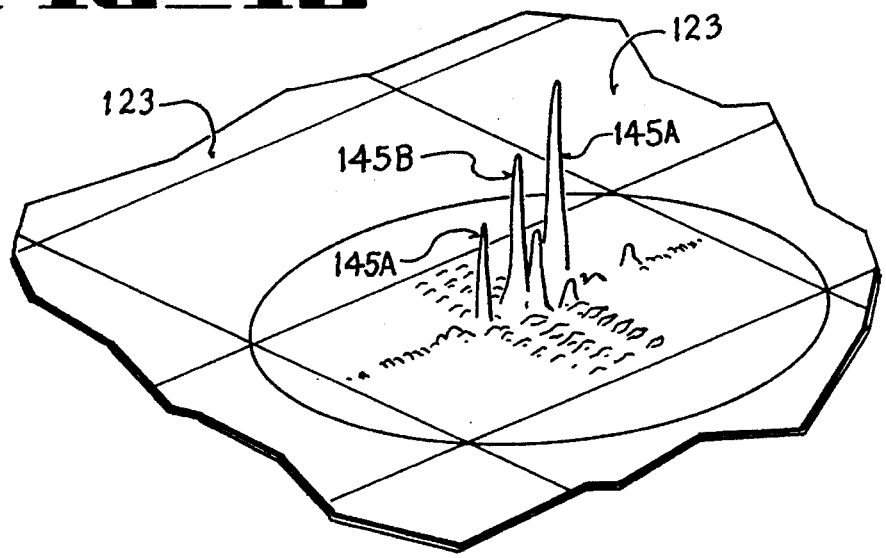
FIG_40
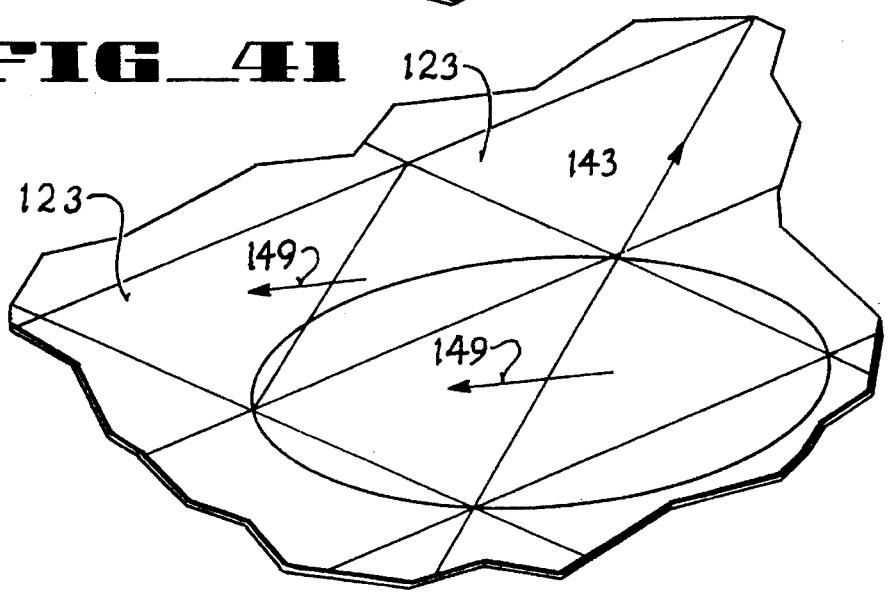
FIG_41
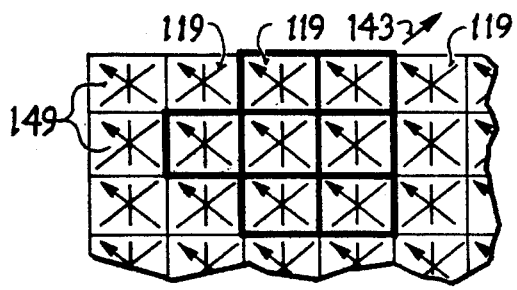
FIG_42
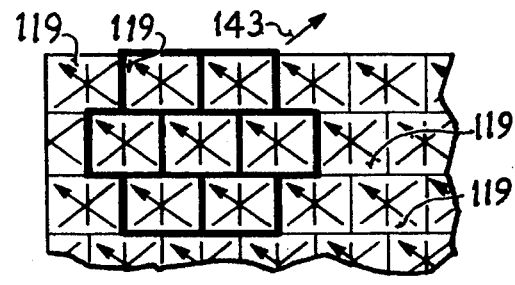
FIG_43

FIG_44
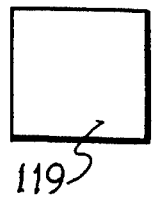
119
FIG_45
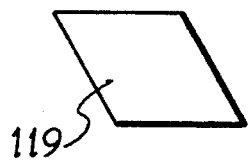
119
FIG_46
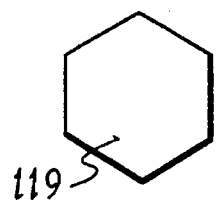
119
FIG_47
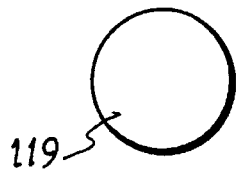
119
FIG_48
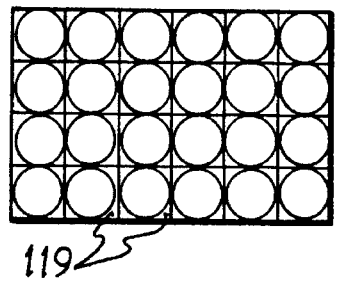
119
FIG_49
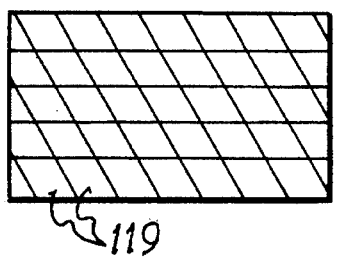
119
FIG_50
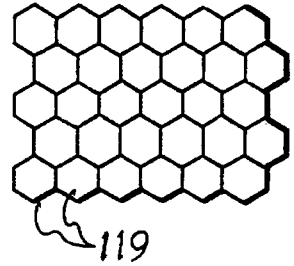
119
FIG_51
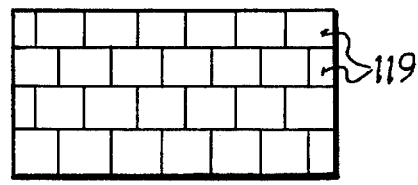
119

FIG_56
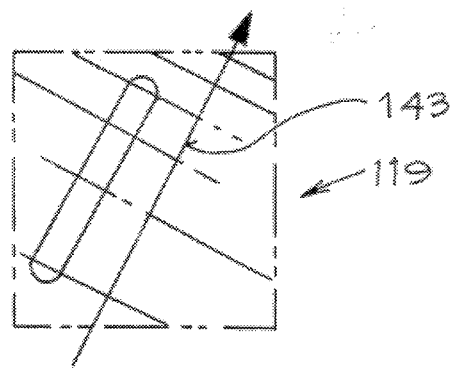
FIG_57
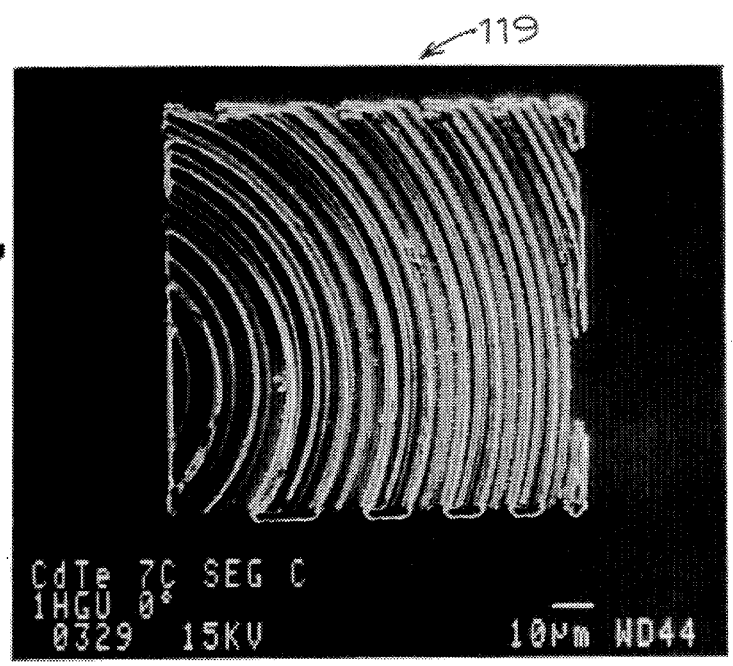
FIG_58
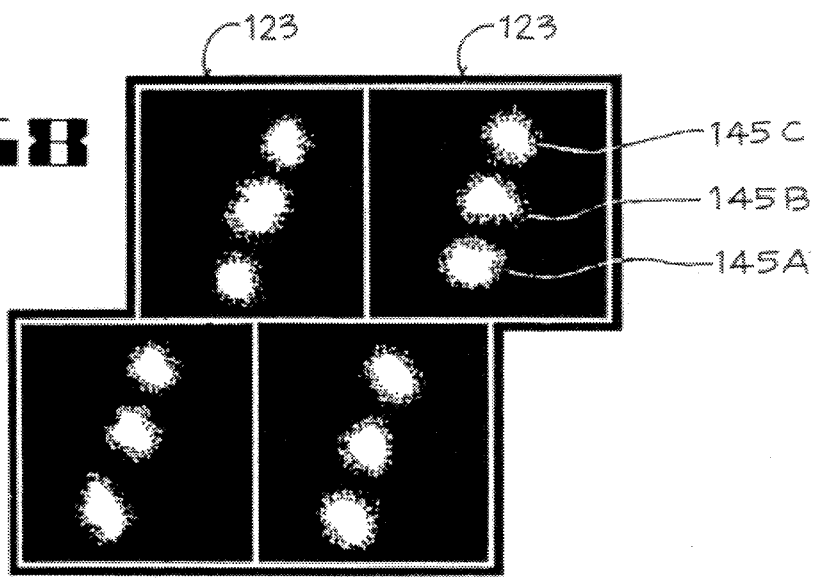

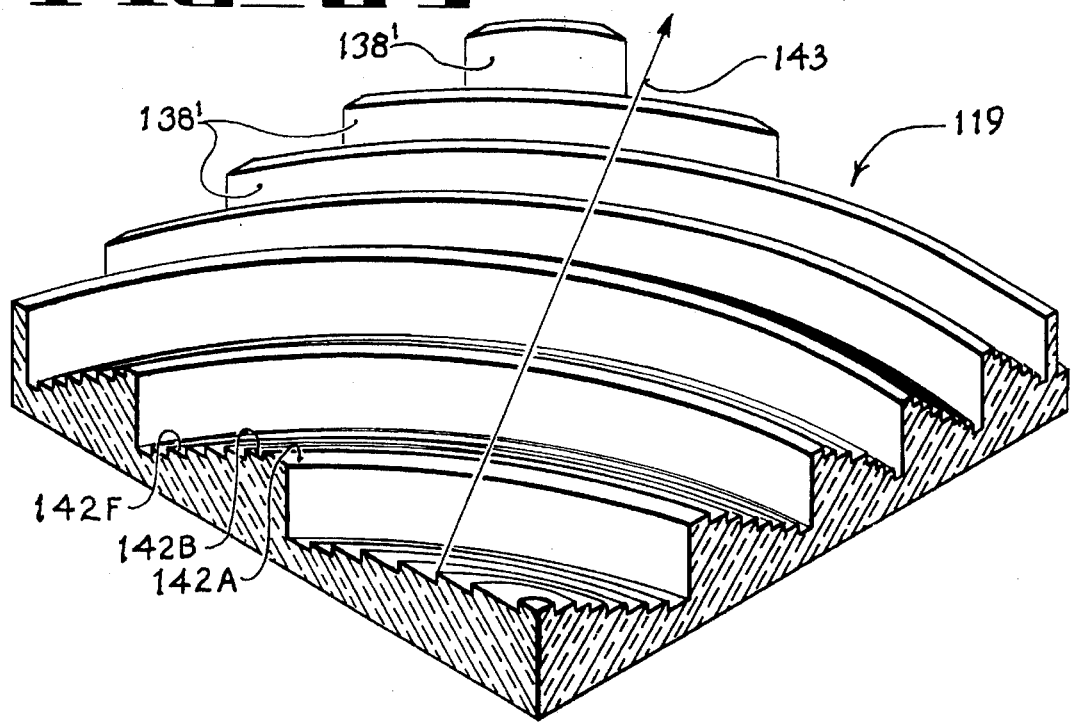
FIG_59
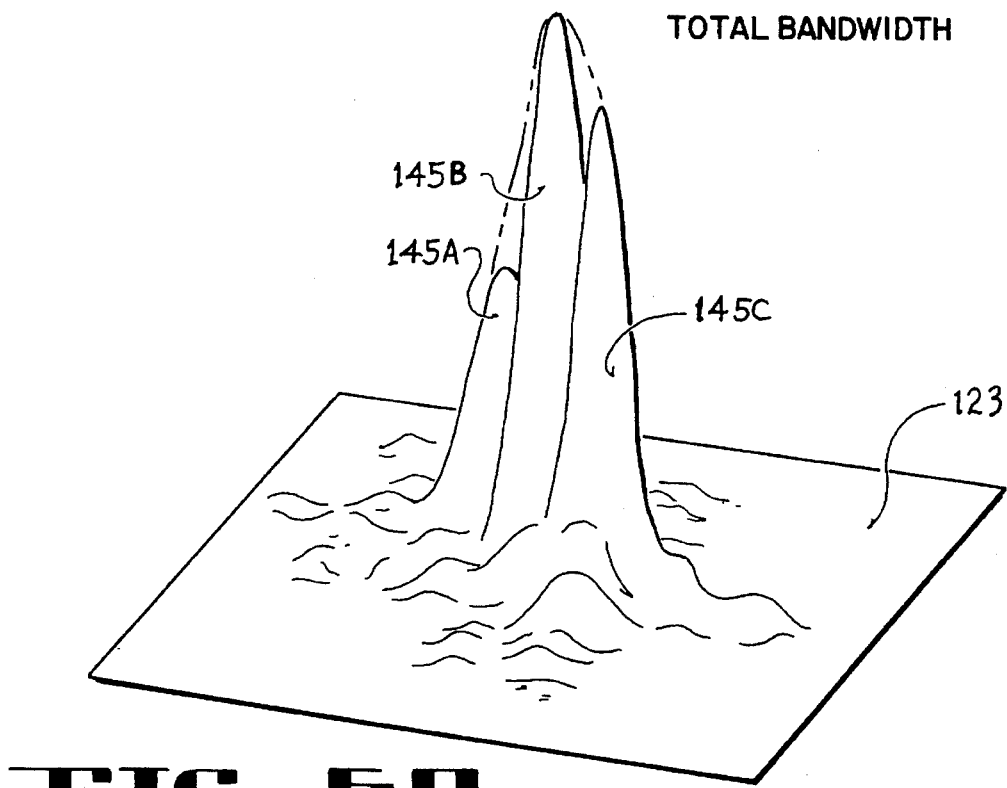
FIG_60

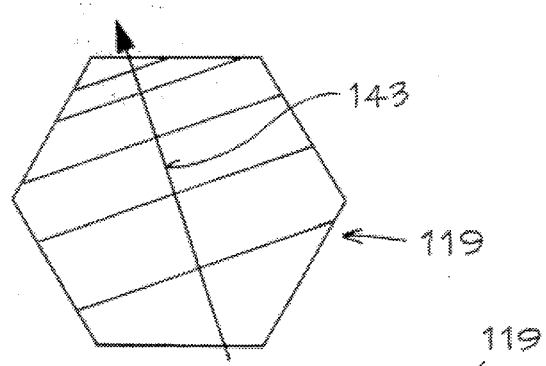
FIG_61
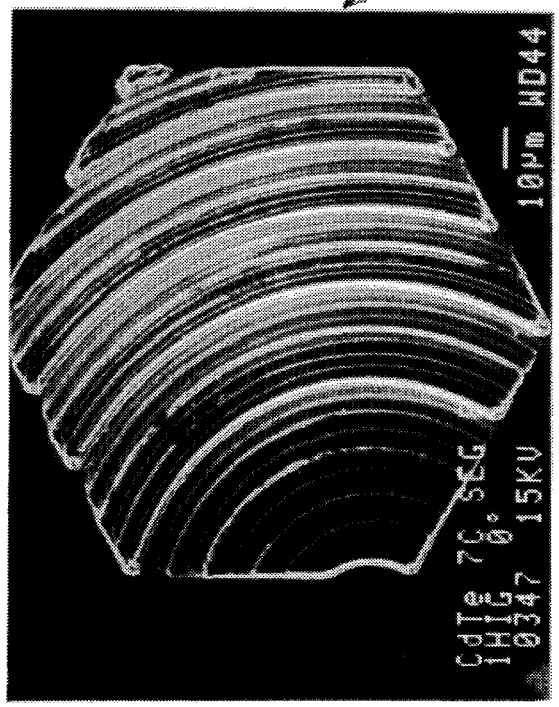
FIG_62
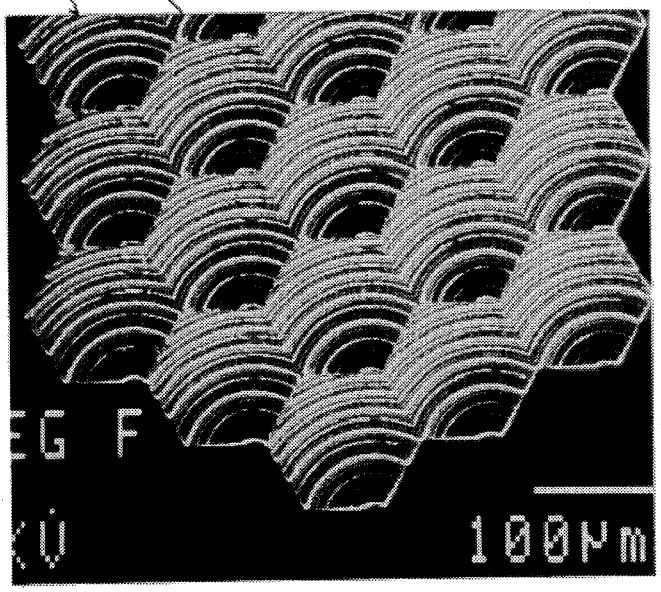
FIG_63

FIG_64
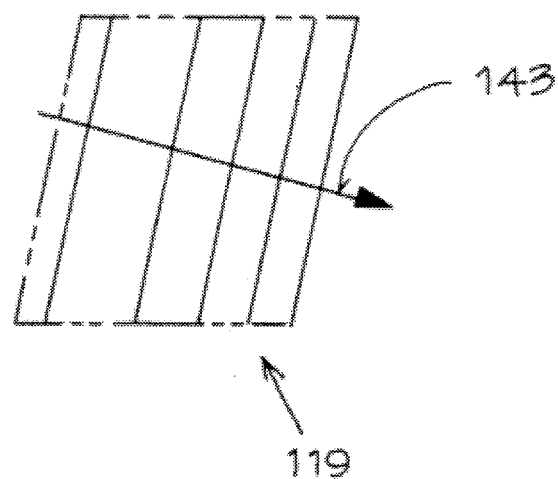
FIG_65
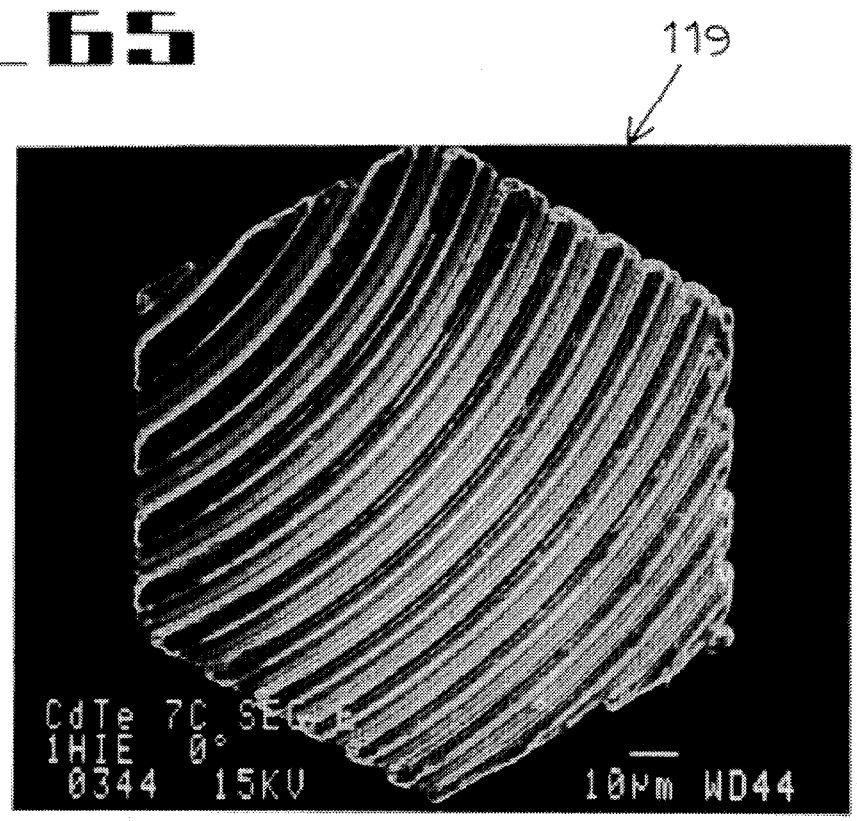

FIG_66
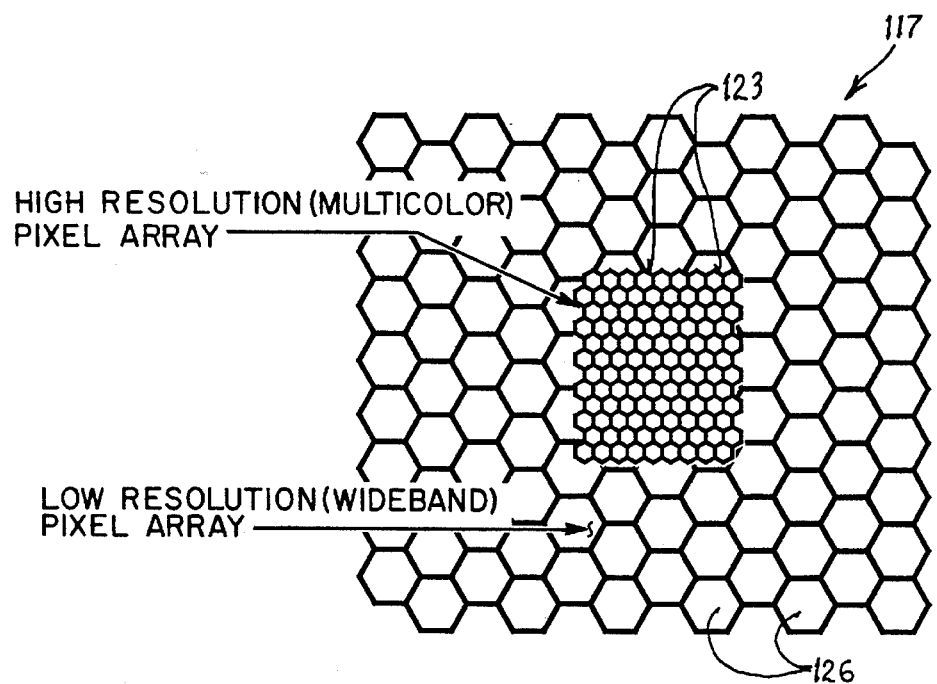
HIGH RESOLUTION (MULTICOLOR) PIXEL ARRAY
LOW RESOLUTION (WIDEBAND) PIXEL ARRAY
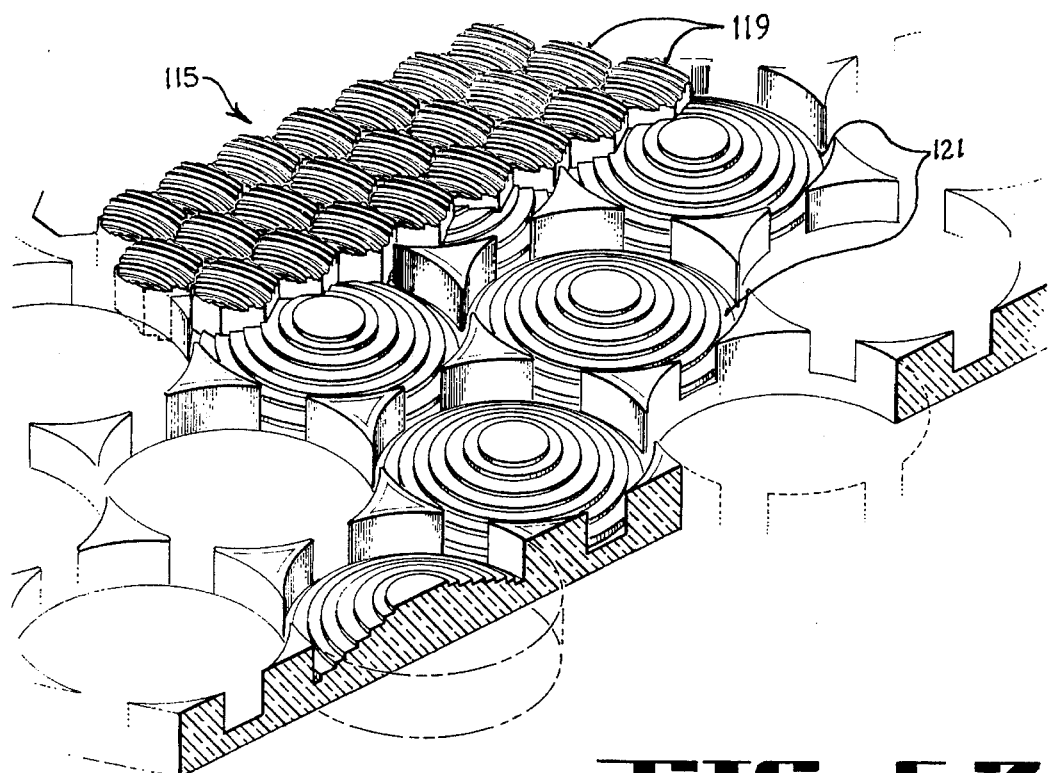
FIG_67

FIG_68
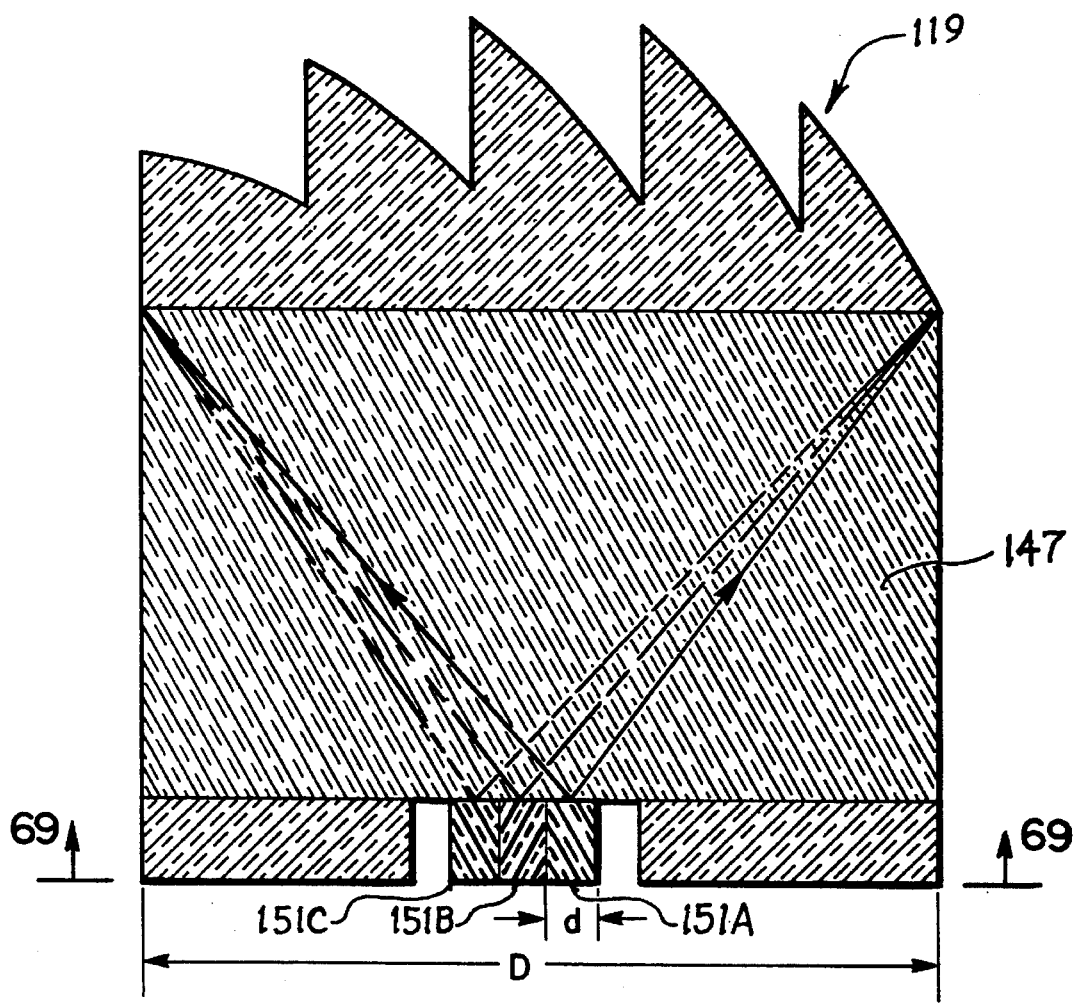
FIG_69
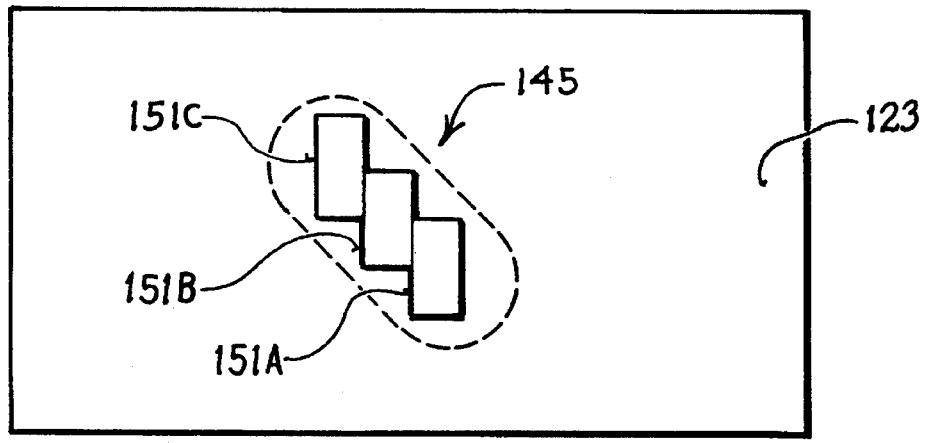

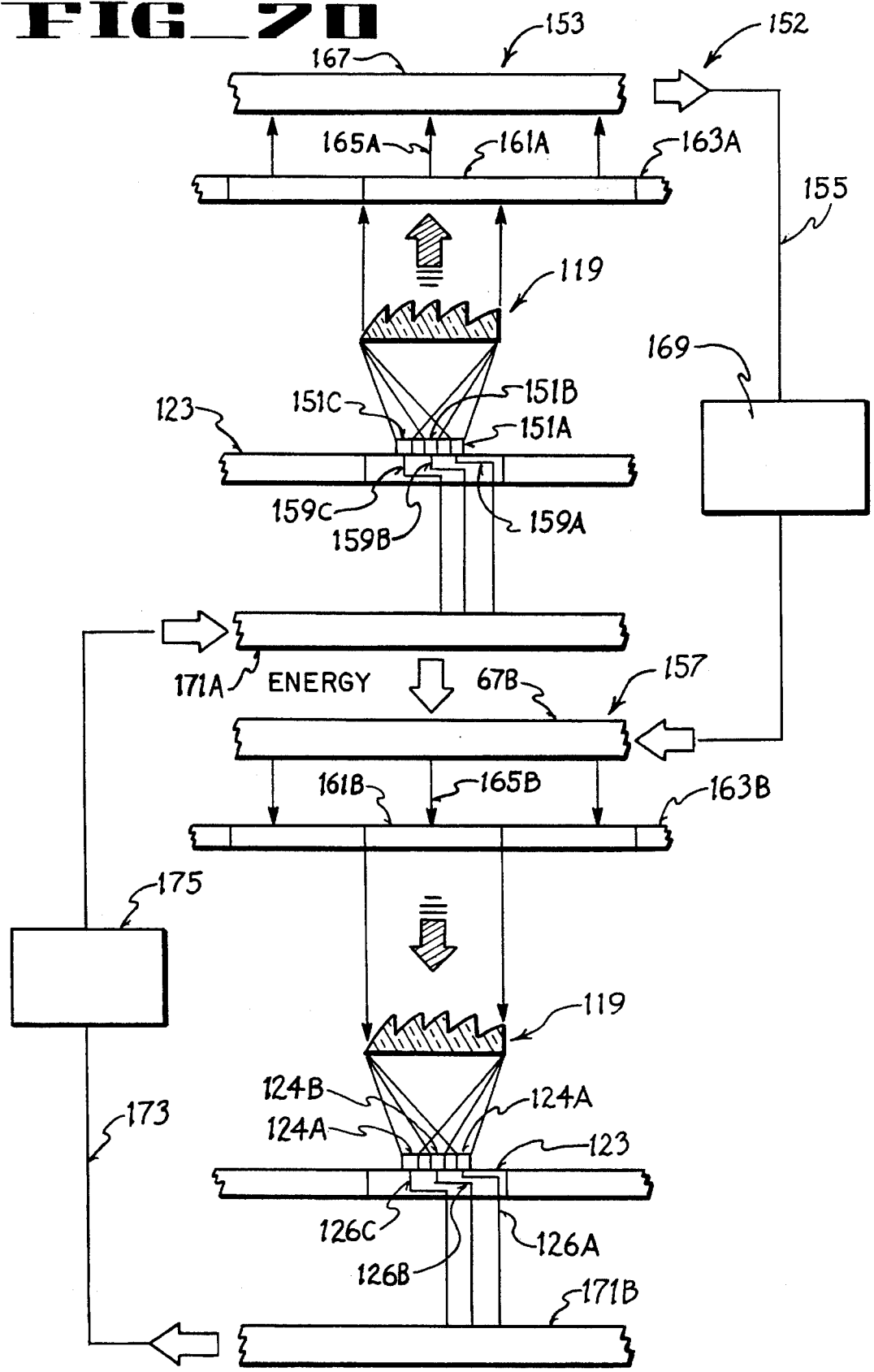

DISPERSIVE MICROLENS

The Government has rights in this invention pursuant to contract DASG60-90-0012 awarded by the Department of the Army.

BACKGROUND OF THE INVENTION

This invention relates to microlens arrays and associated detector/emitter pixel arrays.

This invention relates particularly to dispersive microlens apparatus and methods which can be used in one mode for detecting multiple, different wavelengths from a bandwidth of the wavelengths (existing within an image plane blur spot) and which can be used in another mode for combining a plurality of different, emitted wavelengths into a bandwidth of the wavelengths (at a blur spot in an image plane).

The individual microlenses of the present invention may typically range in size from a diameter of 50 microns to 1 millimeter. Related detectors may be fabricated from bulk material that is thinned to a thickness associated to fast optical design f/1 in the substrates. The microlenses are located, usually in one dimensional or two dimensional arrays, at an image plane, and associated detectors/emitters are located in pixels in a detector/emitter plane which is spaced from the image plane.

The individual microlenses of the present invention may be Fresnel or non-Fresnel microlenses, and may be fabricated by binary or non-binary fabrication techniques, may have a variety of geometric shapes, such as, for example, circular, square, hexagonal, and rhombic.

SUMMARY OF THE INVENTION

In one embodiment of the present invention the microlens method and apparatus are used in a detector mode in focal plane arrays of an optical sensor system.

In this embodiment the focal plane arrays include an array of microlenses at an image plane and an array of detector pixels at a detector plane. Each individual microlens transmits and concentrates a bandwidth of light (existing in a the incident blur spot) to a much smaller blur spot in an associated pixel in the detector plane. The area of detector plane blur spot is thus decoupled from the area of the pixel. The concentration of the optical information into the much smaller pixel plane blur spot produces a high contrast ratio, high fill factor and high optical gain of the optical information in the detector plane blur spot with respect to any existing, unwanted noise present at the detector plane. This concentration into the small detector plane blur spot also frees up relatively large adjacent areas (real estate) in the pixel which can be used for other purposes, such as, for example, the use of multiple detectors in a single pixel and/or micro-channel cooling, or for analog signal processing circuits.

In this embodiment certain ones of the individual microlenses are formed with dispersion means effective to produce, in relation to the bandwidth of light in the image plane blur spot, a controlled dispersion of the bandwidth of light and an elongated detector plane blur spot in which the wavelengths are varied in a progressive way from one end to the other of the elongated blur spot. This dispersion enables more than one wavelength and/or bands of wavelengths to be detected and/or located within the elongated pixel plane blur spot.

The dispersion means comprise a configured, surface which is formed integrally with and in a regular pattern on the individual, dispersive microlens.

Multiple detectors are positioned in the elongated detector plane blur spot to detect multiple, different signals from the optical information in the elongated blur spot. This permits real time discrimination of the optical information for certain qualities, such as, for example, the color and/or temperature of an object or objects generating or reflecting the optical information into the sensor system.

The multiple detector signals can be summed in an acquisition mode to obtain an increased signal. The multiple signals can be used in a discrimination mode to evaluate color contrast (to determine object temperature) and also to discriminate for temperature on the basis of the ratios of the detected energies. This enables the use of a few spectral bands to suppress background.

Two detectors looking at the same instantaneous field of view (IFOV) get the energy from the same object space and get perfect background registration.

The multiple detectors are associated with a related microlens in an array of microlenses in which there is no dead space so that one hundred percent fill factor is obtained.

No scanners or beam splitters are required, so the dispersive microlens provides spatial and temporal registration without incident energy loss.

The multiple, separate detectors can be selectively sized and positioned in the elongated blur spot to pick up different, selected sets of information, dependent upon the sizes and positions of the detectors in the elongated blur spot.

In another embodiment of the present invention dispersive microlens apparatus and methods are used for combining a plurality of different emitted wavelengths of light, emitted from a plurality of emitters within a single emitter plane blur spot, into a bandwidth of light at an image plane blur spot.

In this embodiment a plurality of emitters are positioned at selected locations within an emitter plane blur spot and emit separate, different wavelengths or wavebands of light which are to be combined into a single bandwidth of light at an image plane blur spot.

In this embodiment a dispersive microlens is positioned at the image plane at a distance from the emitter plane which is effective to permit the microlens to receive the light from the plurality of emitters and to form the light into an image plane blur spot at the location of the microlens.

The dispersive microlens includes dispersion means which are effective to combine all of the separate, emitted wavelengths or wavebands into a single bandwidth of light into the image plane blur spot so that the multicolor emitted wavelengths appear as a single, composite color at the surface of the microlens.

In this embodiment the emitter plane blur spot is an elongated blur spot which is so related to the dispersion means of the associated microlens that the wavelengths of emitted light can be varied in a progressive way from one end of the elongated blur spot to the other.

In this embodiment each emitter generates a selected wavelength and/or band of wavelengths which is unique to that emitter and which is within the bandwidth. Each emitter is positioned in the elongated blur spot at a location correlated to the wavelength emitted by that emitter. The output of the emitters are modulated to control the energy level associated with the wavelengths present in the bandwidth at the image plane blur spot and also the relative energy levels of the different wavelengths which are combined into the single bandwidth at the image plane blur spot.

These two embodiments of the present invention can be used separately or in combination with one another for a variety of color detecting, displaying, transmitting and/or generating apparatus and methods, such as, for example, computer flat screen color television, color recording, color facsimile, and color printing.

Microlens apparatus and methods which incorporate the features described above and which are effective to function as described above constitute specific objects of the present invention.

Other and further objects of the present invention will be apparent from the following description and claims and are illustrated in the accompanying drawings, which by way of illustration, show preferred embodiments of the present invention and the principles thereof and what are now considered to be the best modes contemplated for applying these principles. Other embodiments of the invention embodying the same or equivalent principles may be used and structural changes may be made as desired by those skilled in the art without departing from the present invention and the purview of the appended claims.

BRIEF DESCRIPTION OF THE DRAWING VIEWS

FIG. 1 is a side elevation view in cross section of an optical sensor system which utilizes dispersive microlens apparatus and methods of the present invention.

FIG. 2 is a diagrammatic view showing how each of three adjacent microlenses has an individual instantaneous field of view (IFOV) and showing how the energy (or object) in that individual IFOV is transmitted to the detectors associated with the particular microlens.

FIG. 3 is an enlarged, schematic, fragmentary, isometric view showing how individual microlenses (in an array of microlenses located at an image plane) transmit energy and optical information (contained in individual blur spots in the image plane) to related individual pixels in a detector plane.

FIGS. 4A, 4B and 4C are enlarged, fragmentary views, partly in cross section, showing how multiple detectors are associated with non-Fresnel dispersive microlenses (FIG. 4A) and Fresnel dispersive microlenses (FIG. 4B) and showing how a single detector is associated with a wideband non-dispersive microlens (FIG. 4C).

Figure 52:
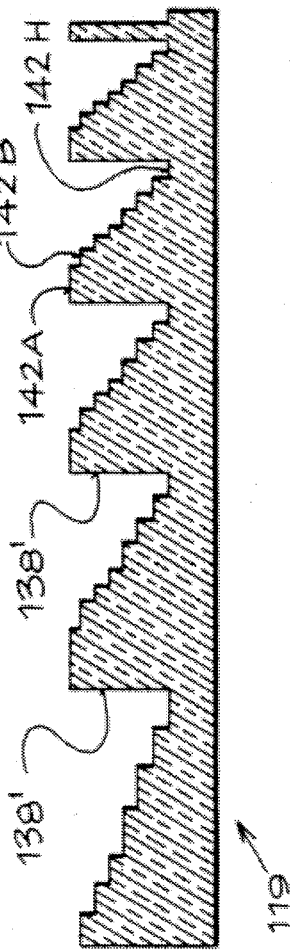

FIG. 5 is an enlarged, fragmentary, plan view showing details of how, in detector arrays (without any associated micro-lenses) used prior to the present invention, two images in blur spots of two instantaneous fields of view could fall, at least in part, upon dead zones between the detectors. FIG. 5 illustrates, in double cross hatched portions of one image, how a large portion of one image could be lost when there are dead zones between such prior art detectors.

FIGS. 6 and 7 are related views showing, respectively, a fragmentary, enlarged plan view of a portion of the image plane and a fragmentary, enlarged view of a related portion of the detector plane.

FIGS. 6 and 7 show how an image, or information, in a blur spot at the image plane is transferred to a much smaller area in a related pixel in the detector plane by a microlens positioned at the blur spot in the image plane.

FIGS. 6 and 7 also show how a blur spot which spans four adjacent microlenses in the image plane can produce four, small fragments of that image in the four related pixels of the detector plane to conserve all of the energy in the image plane blur spot (when there is no dead zone between any of the four adjacent microlenses in the image plane, i.e. when there is a 100% fill factor).

FIGS. 8A and 8B are elevation views showing how each individual microlens at a blur spot in the image plane reduces the size of the image transmitted to the detector plane so that there is space, or real estate, available at the detector plane which can be used for other purposes. Both FIGS. 8A and 8B show how micro cooling channels can be located in such available space in the pixels to provide cooling for adjacent heat producing components.

FIG. 8B shows how multiple detectors can be used in each unit pixel to obtain more than one signal from the information in a blur spot at the image plane when a dispersive microlens of the present invention is positioned at the image plane blur spot.

FIGS. 9 and 10 are enlarged, fragmentary, plan views of a portion of the detector plane showing how multiple detectors can be located in individual pixels in the detector plane. FIG. 9 shows two detectors in each pixel. FIG. 10 shows three detectors in each pixel.

FIGS. 11, 12 and 13 are related views showing how a dispersion producing surface configuration (FIG. 11) is associated with a plano convex microlens (FIG. 12) to form a dispersive non-Fresnel microlens (FIG. 13) in accordance with one embodiment of the present invention.

FIGS. 14, 15 and 16 show Fresnel counterparts to the respective FIGS. 11, 12 and 13 views.

FIG. 17 is an isometric view of a dispersive, Fresnel microlens constructed in accordance with one embodiment of the present invention. The microlens shown in FIG. 17 has a rectangular topology (is in the shape of a rectangle as viewed in plan view), and the transverse axis is not rotated with respect to the topology but is, instead, aligned and parallel with the related sides of the microlens. In FIG. 17 a portion of the central part of one end of the microlens has been broken away to show details of structure.

FIG. 18 is an elevation view, partly in cross section, taken along the line and in the direction indicated by the arrows 18—18 in FIG. 17.

FIG. 19 is an isometric view of another embodiment of a dispersive Fresnel type microlens constructed in accordance with the present invention. The microlens shown in FIG. 19 has a rectangular topology, like the microlens shown in FIG. 17. The dispersive grating is perpendicular to the direction arrow 143. The microlens shown in FIG. 19 differs from the microlens shown in FIG. 17 in the fact that the microlens shown in FIG. 19 is fabricated by a binary fabrication process while the microlens shown in FIG. 17 is fabricated by a non-binary fabrication process.

FIG. 20 is a side elevation view of a dispersive non-Fresnel microlens and shows, in diagrammatic fashion in the lower part of the Figure, how the bandwidth of light existing in the blur spot in the image plane is transmitted through the dispersive microlens and is dispersed into individual wavelengths or individual wavebands A, B and C at specific locations on the detector plane.

FIG. 21 is an isometric view showing specific spectral lines of the distributions (the intensity levels and the area locations) of the dispersed wavelengths or wavebands on the detector plane for a dispersive non-Fresnel microlens like that shown in FIG. 20. FIG. 21 shows, by the height of the cones, the relative intensities of the specified dispersed wavelengths; and FIG. 21 shows, by the areas occupied on the detector plane, the locations of the dispersed wavelengths. The alignment of the locations of the dispersed wavelengths shown in FIG. 21 is a straight line which is canted at an angle with respect to the rectangular sides of the pixel shown in FIG. 21. This angle results from a corresponding angle of rotation of the related grating of the related microlens. The total bandwidth of the light transmitted through the dispersive non-Fresnel microlens of FIG. 20 is distributed within the outer envelope indicated by the dashed outline in FIG. 21; and the wavelength separation is in fact a continuum, rather than just the three separate cones shown for purposes of illustration in FIG. 21.

FIG. 22 is an isometric view of a dispersive, non-Fresnel, binary fabricated microlens constructed in accordance with another embodiment of the present invention. The microlens shown in FIG. 22 has a topology which is generally rectangular shaped, and the dispersion grating is not rotated.

FIG. 23 is an isometric view showing the spectrum distributions (the intensity levels and the area locations) of the dispersed wavelengths or wave bands on the pixel in the detector plane for the dispersive, non-Fresnel, binary microlens shown in FIG. 22. The bandwidth of light in the blur spot at the microlens in the image plane is dispersed to the smaller but elongated blur spot on the detector plane, and the wavelengths in the elongated blur spot in the pixel on the detector plane (as shown in FIG. 23) are varied in a progressive way from one end of the blur spot to the other end. As noted below with reference to FIGS. 35 and 36, the total energies that fall on each detector area (within the total bandwidth) are obtained by a convolution, or integration, of the spectral blur spots and the responsivity function. The alignment of the dispersed wavelengths or wavebands in FIG. 23 is a straight line which runs parallel to the sides of the pixel, and this alignment is produced by a zero rotation of the dispersive grating of the non-Fresnel microlens as shown in FIG. 22.

FIGS. 24, 25 and 26 show the respective high distribution (red), medium distribution (green) and low distribution (blue) components existing in the elongated pixel blur spot shown in FIG. 23. It should be noted that the terms red, green and blue are used here and throughout the text to refer to the distribution in the waveband discussed and not to specific colors as such.

FIG. 24 is an isometric view showing only the distribution (locations) and intensity levels of the longest (in this case red) wavelengths in the elongated pixel plane blur spot shown in FIG. 23.

FIG. 25 is an isometric view showing only the distribution (locations) and intensity levels of the mid (in this case green) wavelengths of the elongated pixel plane blur spot shown in FIG. 23.

FIG. 26 is an isometric view showing only the distribution (locations) and intensity levels of the shortest (in this case blue) wavelengths of the elongated pixel plane blur spot shown in FIG. 23.

FIG. 27 is a side elevation view of a dispersive, Fresnel, non-binary microlens constructed in accordance with another embodiment of the present invention and shows, in diagrammatic fashion in the lower part of the figure, how the bandwidth of light existing in the blur spot at the microlens in the image plane is transmitted through the dispersive microlens and is dispersed into individual wavelengths or individual wavebands C, B and A at specific locations in a pixel on the underlying detector plane.

FIG. 28 is an isometric view showing the spectrum distributions (the intensity levels and the area locations) of the dispersed wavelengths or wavebands on the pixel in the detector plane for the dispersive, Fresnel, non-binary microlens shown in FIG. 27. The bandwidth of light in the blur spot at the microlens in the image plane is dispersed to the smaller but elongated blur spot on the detector plane, and the wavelengths in the elongated blur spot in the pixel on the detector plane (as shown in FIG. 28) are varied in a progressive way from one end of the blur spot to the other so that more than one wavelength can be detected and/or located within the elongated blur spot on the detector plane. The alignment of the dispersed wavelengths or wavebands in FIG. 28 is a straight line which is rotated with respect to the sides of the pixel, and this alignment is produced by a corresponding rotation axis of the dispersive grating of the Fresnel, non-binary microlens shown at FIG. 27.

FIG. 29, 30 and 31 show the respective red (high distribution), green (medium distribution) and blue (low distribution) components existing in the elongated pixel blur spot shown in FIG. 28.

FIG. 29 is an isometric view showing only distribution (locations) and intensity levels of the longest (in this case red) wavelengths in the elongated pixel plane blur spot shown in FIG. 28.

FIG. 30 is an isometric view showing only the distribution (locations) and intensity levels of the mid (in this case green) wavelengths of the elongated pixel wavelengths of the elongated pixel plane blur spot shown in FIG. 28.

FIG. 31 is an isometric view showing only the distribution (locations) and intensity levels of the shortest (in this case blue) wavelengths of the elongated pixel plane blur spots in FIG. 28.

FIG. 32A is a side elevation view of two side by side dispersive, Fresnel, rotated dispersive grating, microlenses formed directly on one surface of the substrate. Each microlens is associated with three related detectors located in a correspondingly rotated blur spot in a related pixel on the opposite side of the substrate.

FIG. 32B is a bottom plan view, taken generally along the line and in the direction indicated by the arrows 32B—32B in FIG. 32A. FIG. 32B shows how the three detectors are aligned in the pixel in the detector plane for detecting the dispersed wavelengths or wavebands within the elongated blur spot indicated by the dashed outline in FIG. 32B.

FIG. 33 is a side elevation view, generally like FIG. 32A, but showing an embodiment in which two loop hole detectors are used in each pixel. The non-binary, non-Fresnel, dispersive microlenses shown in FIG. 33 are fabricated in silicon and are mated to a frontside-illuminated detectors side as the loophole CdTe array.

FIG. 34A is an enlarged elevation view in cross section of one of the detectors of FIG. 33.

FIG. 34B is an isometric view of the detector shown in FIG. 34A.

FIGS. 35 and 36 are related views showing how two sets of detectors in a pixel in the detector plane can be specifically sized and positioned to pick up two different sets of signal information from the same overall color dispersed information contained within the elongated blur spot in the pixel in the detector plane. FIGS. 35 and 36 give a visual representation. The total energies that fall on each detector area are obtained by a convolution, or integration, of the spectral blur spots and the spectral responsivity functions.

FIG. 37 is a graph showing the information obtained from the two different detectors positioned within an elongated blur spot in a single pixel by a convolution of the dispersed optical blur spot and detector responsivity function.

FIG. 38 is an isometric, fragmentary view showing an array of non-dispersive, non-binary, Fresnel microlenses which can be positioned in a peripheral part of the image plane.

FIG. 39 is an isometric view showing the spectral distributions (the intensity level and the area locations) of the wavelengths in the symmetrical spot formed on the detector plane by a non-dispersive microlens like one of the microlenses shown in FIG. 38. FIG. 39 illustrates how the higher order said lobes (extending orthogonally outwardly from the central cone for a square lens in FIG. 39) produce an Airy disk pattern. This orthogonal pattern can produce resulting cross talk noise between adjacent pixels in the detector plane; because the patterns can be aligned, and the side lobes from one pattern can extend into and can add to the side lobes in an adjacent pixel.

FIG. 40 is an isometric, fragmentary view like FIG. 39, but showing how an elongated blur spot formed in the pixel plane by a dispersive microlens in the image plane can also produce higher order side lobes in the pixel which can extend orthogonally into and in alignment with side lobes in adjacent pixels to produce cross talk noise.

FIG. 41 shows how a diagonally rotated dispersion grating angle can result in a diagonal alignment of higher order side lobes which can still result in cross talk noise between diagonally adjacent pixels in the pixel plane.

FIG. 42 shows a topology for square microlenses with a diagonal rotation angle of the dispersion grating which is effective to eliminate orthogonal cross talk noise but which can still result in diagonal cross talk noise between diagonally adjacent pixels.

FIG. 43 shows a topology in which rectangular shaped microlenses, each having a diagonal rotation angle of the dispersion grating, can be longitudinally offset or staggered in adjacent rows to eliminate any diagonal cross talk noise between diagonally adjacent pixels in the detector plane.

FIGS. 44, 45, 46 and 47 show configurations for microlenses.

FIG. 44 shows a rectangular configuration.

FIG. 45 shows a rhombic, trapezoidal configuration.

FIG. 46 shows a hexagonal configuration. This configuration has a number of advantages for maximizing the concentration and distribution of information in a related detector plane.

FIG. 47 shows a circular configuration for a microlens.

FIG. 48 shows a microlens array in which the individual microlenses are circular microlenses.

FIG. 49 shows a microlens array in which the individual microlenses have a rhombic configuration.

FIG. 50 shows a microlens array in which the individual microlenses have a hexagonal configuration.

FIG. 51 shows a microlens array in which each individual microlens has a rectangular configuration and in which each microlens in each row is offset with respect to the microlenses in adjacent rows.

FIG. 52 is an elevation view of a rectangular, Fresnel, binary, dispersive microlens constructed in accordance with an embodiment of the present invention.

Figure 53:
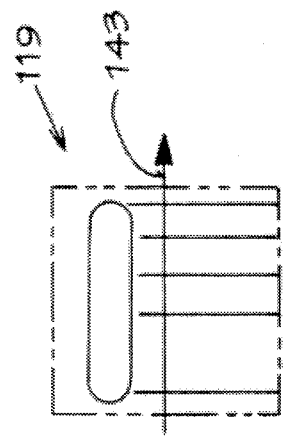

FIG. 53 is a diagrammatic plan view of the microlens shown in FIG. 2 and shows the dispersion grating having a zero rotation angle (as indicated by the direction arrow 143 which is perpendicular to the grating).

Figure 54:
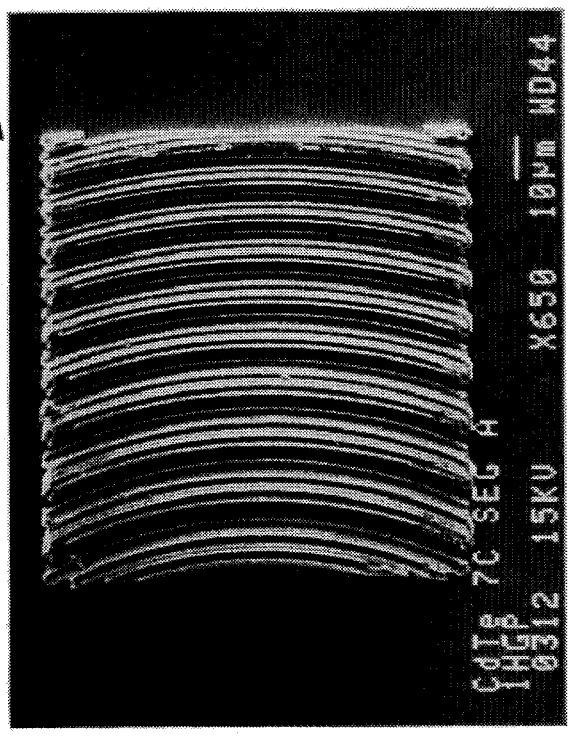

FIG. 54 is a top plan photograph (generated by a scanning electron microscope—SEM) of the fabricated dispersive microlens shown in FIGS. 52 and 53.

Figure 55:
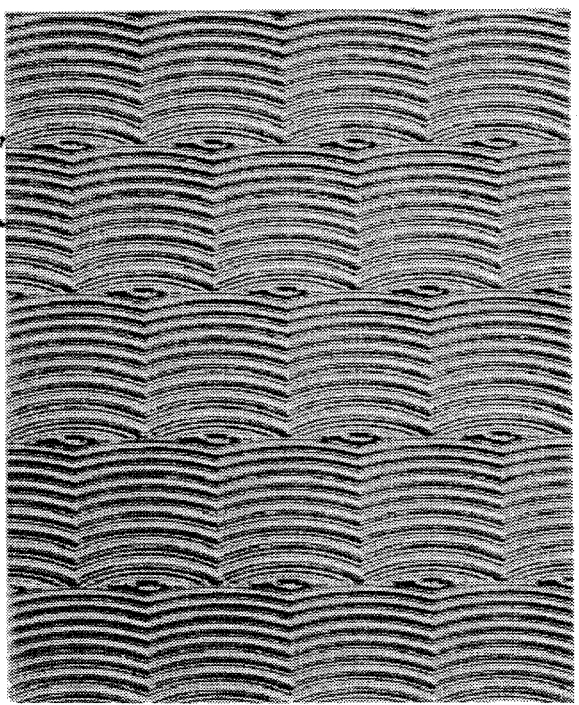

FIG. 55 is a top plan SEM photograph showing a fabricated array of microlenses made up of individual microlenses each having the construction shown in FIG. 54.

FIG. 56 is a diagrammatic plan view, like FIG. 53, but showing a rectangular microlens having the dispersion grating rotated at an angle perpendicular to the direction arrow 143 in FIG. 56.

FIG. 57 is a top plan SEM photograph of the fabricated dispersive microlens shown in FIG. 56 and embodying the Fresnel, binary construction shown in FIG. 52.

FIG. 58 is a top plan view of four pixels in a detector plane, offset in adjacent rows, to correspond to the offset of related rectangular microlenses like the microlens shown in 57, and showing the location of the elongated blur spot in each pixel as produced by the microlens construction shown in FIG. 57.

FIG. 59 is an isometric view of a dispersive, Fresnel microlens like that shown in FIG. 57. FIG. 59 shows a dispersive, rectangular-shaped, binary fabricated, Fresnel microlens having the dispersion grating rotated at the angle indicated by the direction arrow in FIG. 59.

FIG. 60 is an isometric view (similar to FIG. 21) showing specific spectral lines of the distributions (the intensity levels and the locations) of dispersed wavelengths on the pixel in the detector plane for the dispersive, Fresnel, binary microlens shown in FIG. 59. As noted above with reference to FIG. 21, the illustrated spectral blur spots are typical (blue, green, red) and are related to the lambda-low to lambda-high continuum within the total bandwidth (indicated by the dashed outline in FIG. 60).

FIG. 61 is a schematic plan view showing a hexagonal shaped microlens having a dispersion grating inclined at the angle indicated by the direction arrow in FIG. 61.

FIG. 62 is a plan SEM photograph of a fabricated low dispersive, binary, Fresnel, hexagonal shaped microlens having the dispersion grating inclined at the angle indicated in FIG. 61.

FIG. 63 is a top plan SEM photograph of a fabricated test array of hexagonal shape microlenses having the structure of the microlens shown in FIG. 62.

FIG. 64 is a fragmentary, plan view showing a rhombic shaped microlens having a dispersion grating rotated at the angle perpendicular to the direction arrow in FIG. 64.

FIG. 65 is a top plan SEM photograph of a fabricated high dispersive, hexagonal shaped, binary fabricated, Fresnel microlens having a dispersion grating rotated at the angle perpendicular to the direction arrow 143 in FIG. 64.

FIG. 66 is a top plan view of a composite array of pixels located at the detector plane and comprising a high resolution, (multicolor) pixel array of hexagonal shaped pixels in the central part of the composite array and having a lower resolution (wideband) pixel array of pixels in the peripheral part of the array. It should be noted that the use of multicolor and/or wideband may be a particular choice for a particular application. The high resolution region in combination with a low resolution region is often a more fundamental issue.

FIG. 67 is an isometric, fragmentary, enlarged view showing a composite array of microlenses in an image plane for association with the composite array of pixels shown in FIG. 66. High resolution, dispersive, hexagonal microlenses comprise the central part of the composite microlens array; and non-dispersive, low resolution, wideband microlenses make up the outer peripheral part of the composite microlens array.

FIG. 68 is an elevation view showing how three emitters (each emitting a specified wavelength of color—red, green and blue) are arranged in alignment within an axially rotated, elongated blur spot in a pixel in the pixel plane and are associated with a related, same rotated angle of dispersive grating, microlens in an image plane for combining the three separate wavelengths or wavebands of light emitted by the three emitters into a bandwidth of light at a blur spot existing at the location of the dispersive microlens in the image plane. The color content and intensity in the bandwidth of the light in the blur spot at the microlens are dependent upon the relative intensities of the different wavelengths emitted by the three emitters in the detector plane.

FIG. 69 is a bottom plan view taken along the line and in the direction indicated by the arrows 69—69 in FIG. 68.

FIG. 70 is a diagrammatic view showing how the dispersive lens of the present invention is used in one (color combining) mode for combining a plurality of different, emitted wavelengths (emitted from emitters in an emitter plane) into a bandwidth of the wavelengths (at a blur spot in an image plane) and is used in another (color detecting) mode for detecting multiple different wavelengths (by detectors at a detector plane) from a bandwidth of wavelengths (existing within an image plane blur spot) so as to enable color information not only to be emitted and combined but also to be dispersed and detected for color transmitting and regenerating methods and apparatus, such as, for example, color television, color recording, color facsimile and color printing processes and apparatus.

DETAILED DESCRIPTION OF THE PREFERRED EMBODIMENTS

The present invention relates to dispersive microlens apparatus and methods which can be used in a detecting mode for dispersing and detecting multiple different wavelengths or wavebands from a bandwidth of the wavelengths existing within an image plane blur spot) and which can also be used in a combining mode (for combining a plurality of different, emitted wavelengths into a bandwidth of the wavelengths at a blur spot in an image plane).

FIGS. 1 and 2 of the drawings illustrate object imaging environments in which the dispersive microlens apparatus and methods of the present invention are utilized to perform complex object imaging and analysis operations.

FIGS. 68, 69 and 70 of the drawings illustrate color combining environments in which the dispersive microlens apparatus and methods of the present invention are used for combining a plurality of different, emitted wavelengths into a bandwidth of wavelengths at a blur spot in an image plane.

FIG. 70 illustrates how the dispersive microlens apparatus and methods enable color information not only to be dispersed, separated and detected but also to be emitted and combined for color transmitting and regenerating applications, such as, for example, color television, color recording, color facsimile and color printing processes and apparatus.

The use of the dispersive microlens in the first mode (the mode for detecting multiple different wavelengths or wavebands from a bandwidth of the wavelengths) will be described first and will be described with reference to use in a sensor environment of the general kind shown in FIGS. 1 and 2.

FIG. 1 shows a sensor system, indicated generally by the reference numeral 101, which can be used for imaging/detecting an object and which can also provide (by use of the dispersive microlens apparatus and methods of the present invention) real time discrimination of sensed optical information for certain other qualities, such as, for example, color and/or temperature, of the object or objects generating the optical information.

The sensor system 101, as illustrated in FIG. 1, includes imager optics 109, focal plane arrays 111 (comprising microlens arrays and detector arrays), and a signal processing unit 113.

FIG. 2 is a diagrammatic view showing how each of three adjacent microlens 119 has an individual instantaneous field of view (IFOV-1, IFOV-2 and IFOV-3) and showing how the energy (or object) in that individual IFOV is transmitted to the detectors (124A and 124B) associated with the particular microlens.

FIG. 3 is an enlarged, diagrammatic view which illustrates details of the focal plane arrays 111 shown in FIGS. 1 and 2.

The focal plane arrays 111 in FIG. 3 comprise a microlens array 115 in an image plane and a pixel array 117 in a detector plane.

The use of the microlens array 115 at the image plane in the focal plane arrays 111 allows the concentration of incident irradience to a small fraction of the pixel area in the detector plane.

As illustrated in FIG. 3 (and as shown in more detail in the fragmentary enlarged FIG. 67 view), the microlens array 115 (in one embodiment of the invention) is a composite array which comprises a central (foveal vision) array of high resolution, dispersive, individual microlenses 119 surrounded by an outer, peripheral array of non-dispersive, low resolution, wideband, individual microlenses 121. In other embodiments, different combinations of high and low resolution regions may be used and different combinations of dispersive and non-dispersive microlens may be used.

The pixel array 117 contains a plurality of pixels with each individual pixel related to a corresponding individual microlens in the microlens array 115.

Thus, in the specific embodiment shown in FIG. 3, high resolution (multicolor) pixels 123 are located in the central part of the composite pixel array 117 and lower resolution (wideband) pixels 126 are located in the peripheral part of the composite pixel array 117.

As best illustrated in FIGS. 2, 3, 6 and 7, an instantaneous field of view (IFOV), and any object or objects within that instantaneous field of view, are imaged into an individual blur spot 125 at the location of an individual microlens 119 at the image plane. The optical information within this blur spot is transmitted through the microlens 119 to a related pixel 123 in the detector plane. (See FIG. 2.)

As will be described in greater detail below, one or more detectors 124 (see FIGS. 2, 4A, 4B, 4C, 7, 8A, 8B, 9 and 10) are positioned within each pixel in the detector plane for receiving a signal or signals from the reduced size pixel blur spot.

FIGS. 4A, 4B and 4C are enlarged, fragmentary views, partly in cross section, showing how multiple detectors are associated with non-Fresnel dispersive microlenses (FIG. 4A) and Fresnel dispersive microlenses (FIG. 4B) and showing how a single detector is associated with a wideband Fresnel, non-dispersive microlens (FIG. 4C).

It is desirable not to have any dead space in the focal plane arrays 111, for reasons which can best be understood by reference to FIG. 5.

FIG. 5 shows a detector plane used without an associated micro-optics array. An object 127 within a blur spot 125 which falls substantially fully upon a related detector 124 would have substantially all of the energy and information within that object transmitted to a corresponding component in the signal processing unit 113; so a dead zone between adjacent detectors would not have too much significance with respect to the object 127.

However, if (in the previously used FIG. 5, detector-only, focal plane array) an object 129 spans several adjacent detectors 124 and also is disposed above dead zones between the microlenses (as indicated by the double cross-hatched portion 131 of the object image 129 in FIG. 5), then that portion of the object image 129 (which does not fall onto any detector 124) would not be transmitted to the signal processing unit 124 and would be lost.

The present invention includes micro-optics above the detector plane array. As will be more clear from the description to follow, this use of the microlenses permits the detectors to be spaced apart from one another without any problems of dead zone losses as described immediately above in reference to the previously used FIG. 5 detector array construction.

The preferred construction is to have all of the microlenses in the microlens array immediately adjacent one another so as not to have any optically dead space between any of the microlenses.

FIG. 6 shows such construction for square shaped (in plan), Fresnel-type microlenses 121.

FIG. 6 and related FIG. 7 illustrate how all of the optical information within each individual blur spot 125 is preserved and is transmitted to detectors 124 in pixels 123 in the detector plane, even when a blur spot spans more than one individual microlens in the microlens array 115.

Thus, for example, the object image 129 which falls on four adjacent microlenses 121 (in FIG. 6) is fully transmitted to four detectors 124 in the four related pixels 123 (see FIG. 7) in the detector plane.

It should also be noted that each individual microlenses, in the course of transferring the optical information at an image plane blur spot into a smaller detector plane blur spot in a related pixel in the detector plane, is effective to produce a high contrast ratio, high fill factor and high optical gain of the optical information in the detector plane blur spot with respect to any existing, unwanted noise (produced by large detector elements) which may be present at the detector plane.

The optical gain achieved is the area ratio of the microlens to the detector (see FIG. 8A).

The microlens array 115 and pixel array 117 provide high overall optical efficiency, nearly 100% fill factor, extended wavelength response and reduced detector noise levels.

Microlenses constructed in accordance with the present invention may typically range in size from a diameter D of 50 microns to 1000 microns, and the related detectors may be fabricated from bulk material that is thinned to a thickness t that represents an f/1 lens.

Because the microlenses transfer the optical information in the image plane blur spots into respective smaller detector plane blur spots in respective detector plane pixels, the small detector plane blur spots (corresponding generally to the diameter d of the detector 124 shown in FIG. 8A) leave relatively large adjacent areas, or real estate, in the detector plane which can be used for other purposes.

As shown in FIG. 8A and 8B, micro cooling channels 133 can be positioned in the relatively large adjacent areas and used for cooling nearby structure.

The available real estate may also be utilized for analog signal processing circuits, such as, for example, the analog circuits 126 in FIGS. 8A and 8B. As will be described in more detail below, the circuits can be conventional detector read-out circuits, detector signal adding circuits or ratioing circuits, as the system design requires.

As also indicated by FIG. 8A, and as will be described in more detail below, multiple detectors, such as the detectors 124A, 124B and 124C shown in FIG. 8B, can be positioned in a number of locations and in a variety of alignments within each individual pixel. Having the space available to do this in a detector plane pixel is a benefit which is of particular utility in connection with a dispersive microlens like the dispersive, high resolution microlens 119 shown in FIG. 8B, as will be described in more detail below.

FIG. 9 is a fragmentary plan view which shows how two detectors 124A and 124B can be positioned (in this case orthogonally) in each unit pixel 123.

FIG. 10 is a fragmentary top plan view showing how three detectors 124A, 124B and 124C may be positioned within each unit pixel 123.

It should be noted that the blur spot 125 results from a combination of refraction and diffraction. The blur resulting from refraction (geometric optics) results from the different focus of different wavelengths. The blur caused by diffraction (wave optics) is inherent to a certain degree in all refractive (geometric optics) lenses. This blur spot phenomenon which results primarily from refraction (geometric optics) and, to a much lesser extent, diffraction (wave optics) of lenses is described at pages 727 and 728 of *Physics* by Hausmann and Slack, 3rd edition, 1948, and published by D. Van Nostrand Company, Inc., New York. These pages of this reference are incorporated by reference in this application.

In accordance with the present invention, a microlens (1) is constructed to transmit a selected bandwidth of light existing in the incident blur spot at the microlens plane 115 to a smaller pixel blur spot in a pixel plane 117 spaced at a selected distance from the microlens and (2) includes dispersion means for producing both a controlled dispersion of the bandwidth of light (as the light is transmitted to the smaller blur spot) and also an elongated shape of the smaller pixel blur spot (in which the elongated shape wavelengths or wavebands are varied in a progressive way from one end of the elongated blur spot to the other so that more than one wavelength can be detected and/or located within the elongated blur spot).

The dispersion means comprise a configured surface formed integrally on the microlens.

FIGS. 11, 12 and 13 are related views showing how a dispersion producing surface configuration (FIG. 11) can be visualized as being combined with a plano convex surface configuration microlens (FIG. 12) to form a single, combined surface, dispersive non-Fresnel microlens (FIG. 13) in accordance with one embodiment of the present invention.

FIG. 12 shows a plano convex microlens 137 having a convex surface 140.

When the dispersion surface means 135 shown in FIG. 11 are combined with a plano convex surface microlens 137 shown in FIG. 12 a dispersive microlens 119 shown in FIG. 13 is obtained. The curved surfaces 142 of the dispersive microlens 119 have curvatures which are a combination of the curved surface 140 of FIG. 12 and the inclined surfaces of the blazed diffraction grating 136 shown in FIG. 11.

The surfaces 138 shown in FIG. 13 correspond to the surfaces 138 shown in FIG. 11 for producing the dispersion effects.

FIGS. 14, 15 and 16 show Fresnel counterparts to the respective FIGS. 11, 12 and 13.

In FIG. 16 the surfaces 138' are vertical surfaces due to the Fresnel construction.

The dashed lines shown in FIG. 16 are included just to represent the amount of material which is eliminated thus resulting in a thinner wafer when the lens is fabricated in a Fresnel structure rather than in a non-Fresnel structure.

FIG. 17 is an isometric view of a dispersive, Fresnel microlens 119 constructed in accordance with one embodiment of the present invention.

The dispersive microlens 119 shown in FIG. 17 is basically like the lens shown in FIG. 16 but is shown (in FIG. 17) mounted on a substrate 141.

The substrate 141 may be a separate material if required for a particular optomechanical application, or the substrate 141 may be common for the lenses on one side and the detectors on the other side (back illuminated detectors).

The microlens 119 shown in FIG. 17 has a rectangular topology (is in the shape of a rectangle as viewed in plan view), and the grating is not rotated with respect to the topology but is instead, aligned and parallel with the related sides of the microlens. In FIG. 17 a portion of the central part of one end of the microlens has been broken away to show details of structure.

FIG. 18 is an elevation view, partly in cross section, and is taken along the line and in the direction indicated by the arrows 18—18 in FIG. 17.

The dispersive, Fresnel microlens shown in FIG. 17 is fabricated by non-binary techniques.

FIG. 19 shows a dispersive, Fresnel microlens having a rectangular, square topology and a non-rotation grating angle (all similar to the microlens shown in FIG. 17), but the microlens 119 shown in FIG. 19 is fabricated by a binary fabrication process.

The angle of the dispersive grating is perpendicular to the direction arrow 143 in FIG. 19.

FIG. 19 shows, in the dashed outline beneath the direction grating arrow 143, the cross section configuration of the Fresnel-type dispersive microlens in that part of the microlens.

As illustrated in FIG. 19, the vertical wall surfaces 138' which signify the edges of Fresnel zones, are curved surfaces (as viewed in plan) rather than straight lines.

Because the dispersive microlens 119 is constructed by binary fabrication, the surfaces 142 are not smoothly curved (like the smoothly curved surfaces 142 shown in FIG. 17) but are instead formed as a series of discrete levels 142A, 142B, 142C, 142D, 142E and 142F. The number, n, of discrete levels produced is a function ($n=2^M$) of the number, M, of photolithographic and anisotropic etching steps (Number of Masks) involved in the fabrication. Note that $2^M$ is the definition of binary as a number. The number of levels determines the smoothness to which the surface can be approximated and, consequently, its efficiency.

As noted above, the dispersive microlens of the present invention transmits a selected bandwidth of light (existing in the incident blur spot 125 at the microlens) to a much smaller pixel blur spot in a plane space at a selected distance from the microlens. This much smaller pixel blur spot is indicated in FIG. 20 by the reference numeral 145. In FIG. 20 the blur spot 145 is shown, for easier viewing, larger than and out of scale to the actual ratio of diameters D (at the image plane) to d (at the detector plane).

The dispersive means on the microlens produce both a controlled dispersion of the bandwidth of the light (as the light is transmitted to a smaller pixel blur spot) and also an elongated shape of the smaller pixel blur spot. The wavelengths or wavebands in the elongated pixel blur spot are varied in a progressive way from one end of the elongated blur spot to the other so that more than one wavelength can be detected and/or located within the elongated blur spot.

FIGS. 20 and 21 illustrate how the bandwidth of light existing in the blur spot 125 (see FIG. 6) at the microlens 119 in the image plane is transmitted (see the illustrative light rays indicated by the dashed lines in FIG. 20) through the dispersive microlens and is dispersed into individual wavelengths or wavebands 145A, 145B and 145C within the elongated detector plane blur spot 145 at specific locations on the detector plane.

FIG. 21 is an isometric view showing selected wavelengths from the spectrum distributions (the intensity levels and the area locations) of the dispersed wavelengths or wavebands 145A, 145B and 145C on the detector plane pixel 123 for a dispersive, non-Fresnel microlens like that shown in FIG. 20. FIG. 21 shows, by the height of the cones 145A (blue), 145B (green) and 145C (red), the relative intensities of the dispersed wavelengths or wavebands.

As noted above in the description, the use of the terms blue, green and red is a use to indicate the low, medium and high wavelengths from the spectral band existing in the blur spot. The use of the terms is not intended to refer to specific, visible colors as such.

FIG. 21 shows, by the areas occupied (by the basis of the cones 145A, 145B and 145C) on the detector plane, the locations of the dispersed wavelengths or wavebands. The alignment of the locations of the dispersed wavelengths or wavebands 145A (blue), 145B (green), and 145C (red) shown in FIG. 21 is a straight line which is canted at an angle with respect to the rectangular sides of the pixel 123 shown in FIG. 21. This angle results from a corresponding angle of rotation of the related grating of the related microlens 119 shown in FIG. 20.

FIG. 22 is an isometric view of a dispersive, non-Fresnel binary fabricated microlens constructed in accordance with another embodiment of the present invention. The microlens 119 in FIG. 22 has a topology which is generally square shaped, and the axis of the dispersion grating is aligned with the sides of the microlens so that there is no rotation to this axis. The dashed lines in FIG. 22 show the cross sectional configuration of the microlens at the locations of the dashed lines.

FIG. 23 is an isometric view showing the spectrum distributions (the intensity levels and the area locations) of the dispersed wavelengths or wavebands on the pixel 123 in the detector plane for the dispersive, non-Fresnel, binary microlens 119 shown in FIG. 22. The bandwidth of light in the blur spot 125 at the location of the microlens 119 in the image plane is dispersed to the smaller but elongated blur spot 145 on the detector plane. The wavelengths in the elongated blur spot 145 in the pixel 123 on the detector plane (as shown in FIG. 23) are varied in a progressive way from one end of the pixel plane blur spot to the other so that more than one wavelength can be detected and/or located within the elongated blur spot 145 on the detector plane. The elongated blur spot is dispersed into the respective components 145A (blue), 145B (green), and 145C (red) components as shown in FIG. 23. The alignment of the dispersed wavelengths or wavebands of the pixel plane blur spot 145 in FIG. 23 is a straight line which runs parallel to the sides of the pixel 123, and this alignment is produced by a zero angle rotation of the dispersive grating on the non-Fresnel microlens 119 shown in FIG. 22.

FIGS. 24, 25 and 26 show the respective red, green and blue components existing in the elongated pixel plane blur spot shown in FIG. 23.

FIG. 24 is an isometric view showing only the distribution (location) and intensity levels of the longest (in this case red) wavelengths in the elongated pixel plane blur spot shown in FIG. 23.

FIG. 25 is an isometric view showing only the distribution (location) and intensity levels of the mid (in this case green) wavelengths in the elongated pixel plane blur spot shown in FIG. 23.

FIG. 26 is an isometric view showing only the distribution (locations) and intensity levels of the shortest (in this case blue) wavelengths of the elongated pixel plane blur spot shown in FIG. 23.

FIG. 27 is a side elevation view of a dispersive, Fresnel, non-binary, rotated grating axis, microlens 119 constructed in accordance with another embodiment of the present invention.

FIG. 28 is an isometric view (generally similar to the isometric view shown in FIG. 23) showing the spectrum distributions (the intensity levels and the area locations) of the dispersed wavelengths or wavebands 145A (blue), 145B (green), and 145C (red) which make up the elongated pixel plane blur spot 145 produced by the microlens 119 shown in FIG. 27. The alignment of the dispersed wavelengths or wavebands in FIG. 28 is a straight line which is rotated with respect to the sides of the pixel 123, and this alignment is produced by a corresponding rotation axis of the dispersive grating of the microlens 119 shown in FIG. 27.

FIGS. 29, 30 and 31 show the respective red, green and blue components existing in the elongated pixel plane blur spot 145 shown in FIG. 28.

There are a number of ways which the dispersive microlens 119 and associated detectors 124 can be structured in accordance with the present invention.

FIGS. 32A and 32B show one way, and FIGS. 33, 34A and 34B show another way.

In the construction shown in FIGS. 32A and 32B, dispersive, Fresnel microlenses with rotated grating microlenses 119 are formed directly on one surface of a commercially available cadmium tellurium (CdTe) substrate 147.

FIG. 33 shows how a dispersive, non-Fresnel, microlenses 119 fabricated in silicon (Si) is mated to a frontside-illuminated, commercially available, loophole array of two CdTe detectors 124A and 124B in each pixel plane blur spot 145.

As illustrated in FIG. 33, one detector 124A can be used to detect one bandwidth of colors in the elongated pixel plane blur spot 145 and another detector 124B can be used to detect another, different bandwidth of colors within the elongated pixel plane blur spot 145.

The constructions shown in FIGS. 32A, 32B and 33 are illustrated as monolithic integration construction, but (for clarity of illustration in the drawing views) the material between the dispersive microlenses and detectors has been left clear rather than crosshatched.

This positioning and selection of multiple detectors to detect multiple signals from the single, elongated pixel plane blur spot 145 will be described in more detail below with reference to FIGS. 35 and 36.

Because the dispersive microlenses of the present invention disperses the component wavelengths or wavebands of light within the elongated pixel plane blur spot 145 in a progressive way and at exact locations in the pixel plane blur spot, a plurality of detectors can be positioned at particular locations within the elongated blur spot to detect specific signals which are dependent upon the locations of the detectors in the pixel plane blur spot. This feature of the present invention is best illustrated in FIGS. 35 and 36.

FIGS. 35 and 36 are related views showing how two sets of detectors in a pixel 123 in the detector plane can be specifically sized and positioned to pick up two different sets of signal information from the same overall color dispersed information contained within the elongated blur spot 145 in the pixel 123 in the detector plane. The particular selection chosen is system dependent.

The uses of the two sets of detectors illustrated in FIGS. 35 and 36 permit the pick-up of two different sets of signal information from the long, medium and short wavelengths within any given bandwidth. In the particular example illustrated in FIGS. 35 and 36 the illustrated band is long wavelength infrared (LWIR) in the 8–12 micron bandwidth.

This 8–12 LWIR is an example. Similar results may be generated in other wavelength bands, i.e., visible (Vis) near infrared (NWIR), short infrared (SWIR), mid infrared (MWIR) region.

FIG. 35 shows how one detector 124A is sized and positioned to pick up a signal which is representative of the energy contained within both the 145C (red, about 12 micron) wavelengths and the 145B (green, about 10 micron) wavelengths while the other detector 124B is sized and positioned to pick up a signal which is representative of the energy primarily within the 145A (blue, about 8 micron) wavelength of the elongated detector plane blur spot 145.

In FIG. 35 the dispersive microlens which produces the elongated blur spot 145 is a 100 micrometer square, Fresnel microlens having a rotated grating which is rotated to an angle of 14 degrees (perpendicular to the line indicated by the direction arrow 143). Grating rotation/canting angle is selected from a design requirement to minimize optical cross-talk between neighboring pixels. The microlens was fabricated by a binary fabrication process utilizing two photolithographic and anisotropic etching steps. The resulting blur spot 145 shown in FIG. 35 is basically like that illustrated in FIG. 28 of the drawings.

FIG. 36 shows how a different set of signals can be obtained (from the same pixel plane blur spot as shown in FIG. 35) by using a set of detectors which are positioned at locations different from the set of detectors shown in FIG. 35.

In FIG. 36 the detector 124A is sized and positioned to pick up a signal which represents all of the energy contained within the 145C portion (the red, about 12 micron) wavelengths and part of the energy contained within the longer wavelengths end of the 145B portion (the red-green, about 11 micron) wavelengths. The other detector 124B is positioned to pick up a signal which is representative of all of the information contained within the portion 145C (the blue, about 8 micron) wavelengths and a part of the 145B portion (the green, about 9 to about 10 micron) wavelengths. Thus, the detector 124B picks up a signal which represents the energy contained within the about 10 to about 8 micron waveband and the detector 124A picks up the energy contained in the about 12 to about 11 waveband in the FIG. 36 positioning of the two detectors.

Other topologies, detector layouts, size selection, fabrication techniques and Fresnel/non-Fresnel selections can be used for other, specific applications.

FIG. 37 is a graph which illustrates how two different detectors positioned within a single elongated blur spot in a single pixel (see FIG. 33) provide multiple signals which can be used to obtain highly effective information with regard to objects imaged within the blur spot at the dispersive microlens.

The detectors in each pixel can be summed in the acquisition mode to obtain an increased signal.

In the discrimination mode the color contrast is evaluated to determine the object temperature.

The ratio of the energies is also used as a temperature discriminator.

The present invention recognizes the possible problem of cross talk noise between adjacent pixels in the detector plane and provides a number of constructions and arrangements for minimizing or eliminating such cross talk noise.

How this problem of possible cross talk noise can develop will now be discussed with reference to FIGS. 39, 40, 41, 42 and 43.

FIG. 39 shows the pixel plane blur spot 125 formed within a pixel 126 by a single, non-dispersive, wideband microlens (such as, for example, a single microlens 121 shown in FIG. 38).

FIG. 39 shows how the blur spot 125 has higher order side lobes 125-1, 125-2, 125-3, etc. (extending orthogonally outwardly from the central cone in FIG. 39). This produces an Airy disk pattern when the microlens is a simple, wideband, non-dispersive lens like a microlens 121 shown in FIG. 38. This orthogonal pattern can produce resulting cross talk noise between adjacent pixels in the detector plane because (depending on how the microlenses and pixels are aligned in the respective arrays) the noise patterns can be aligned and the side lobes from one pattern in one pixel can extend into and can add to the side lobes in an adjacent pixel.

FIG. 40 shows how an elongated blur spot 145 formed in a pixel 123 in the pixel plane by a dispersive microlens in the image plane can also produce higher order side lobes which can extend orthogonally into and in alignment with side lobes in adjacent pixels to produce cross talk noise. The higher order side lobes are illustrated but are not numbered in FIG. 40.

FIG. 41 shows how a diagonally rotated dispersion grating angle (a grating perpendicular to the arrow 143) can result in a diagonal alignment of higher order side lobes which can still result in cross talk noise between diagonally adjacent pixels 123 in the pixel plane, even though the transverse higher order side lobes (indicated by the direction arrows 149 in FIG. 41) are laterally offset from one another between adjacent pixels 123.

FIG. 42 shows a topology for rectangular microlenses with a diagonal rotation angle (perpendicular to the direction arrow 143) of the dispersion grating which is effective to eliminate orthogonal cross talk noise (in the direction indicated by the arrows 149 in FIGS. 41 and 42) but which can still result in diagonal cross talk noise (in the direction indicated by the direction arrow 143) between diagonally adjacent pixels.

FIG. 43 shows a topology in which rectangularly shaped microlenses, each having a diagonal rotation angle (perpendicular to the direction arrow 143) of the dispersion grating, can be longitudinally offset or staggered in adjacent rows to eliminate any diagonal cross talk noise between diagonally adjacent pixels in the detector plane.

FIGS. 44 through 51 illustrate topologies and arrangements of arrays of microlenses which may be used in the present invention.

Two basic features are thus available, in accordance with the present invention, for optimizing a construction to eliminate or to modulate signal to noise. The two features are topology (pixel shape) and grating orientation. By combining these two features in a specific way for a specific application the signal to noise can be optimized.

FIGS. 44, 45, 46 and 47 show respective square, rhombic, hexagonal and circular configurations for microlenses. Any and all of these configurations may incorporate dispersive means so that the microlenses are dispersive microlenses 119 rather than wideband, non-dispersive microlenses. Any and all of these configurations can also be used for wideband, non-dispersive microlenses.

The various configurations of the individual microlenses shown in FIGS. 44–47 can be arranged in the various arrays shown in FIGS. 48–51.

In addition, as illustrated in FIG. 67, composite arrays (which contain combinations of microlens shapes and features) can be utilized to obtain specific, desired results.

FIGS. 52–55 illustrate how a square, Fresnel, binary fabricated, dispersive microlens 119 having a zero rotation angle grating (perpendicular to the arrow 143 in FIG. 53) is assembled in a high resolution microlens array (see FIG. 55) with individual microlenses offset in adjacent rows (see FIG. 55). As noted above FIGS. 54 and 55 are photographs of a fabricated microlens and a fabricated microlens array. The photographs were generated by a scanning electron microscope—SEM.

FIGS. 56–58 are related views showing how a dispersive, Fresnel-type, binary fabricated, microlens 119 like that shown in FIG. 52, but having a rotation grating angle (perpendicular to the arrow 143) as illustrated in FIG. 56, and arranged in longitudinally offset relationship in adjacent rows, produces offset blur spots 145 in the related pixels 123 in the pixel plane so as to minimize or to totally eliminate cross talk noise between both laterally and diagonally adjacent pixels.

FIG. 59 is an isometric view of a dispersive, Fresnel microlens like the microlens shown in FIG. 57. FIG. 59 shows a dispersive, square shaped, binary fabricated, rotated angle grating, Fresnel microlens having the dispersion grating rotated at the angle perpendicular to the direction arrow 143 in FIG. 59.

FIG. 60 is an isometric view showing the spectrum distribution (the intensity levels and the locations) of the dispersed wavelengths or wavebands 145A, 145B and 145C in the pixel blur spot on the pixel 123 as produced by the microlens 119 shown in FIG. 59. FIG. 60 shows, in isometric view, the pixel blur spot locations and alignments (which are also shown in FIG. 58).

FIGS. 61, 62 and 63 show how low spectral resolution, dispersive hexagonal shaped, Fresnel-type, binary fabricated, microlenses (having the dispersion grating inclined at an angle perpendicular to the direction arrow 143 in FIG. 61) are combined in a low spectral resolution microlens array as shown in FIG. 63.

The microlens array shown in FIG. 63 is also shown in the upper left hand part of the fragmentary FIG. 67 showing.

FIG. 64 is a fragmentary, diagrammatic plan view showing a rhombic shaped dispersive microlens having a dispersion grating rotated at an angle perpendicular to the direction arrow 143.

FIG. 65 is a top plan view of a high dispersive, hexagonal shaped, binary fabricated, Fresnel microlens having a dispersion grating rotated at approximately the same angle as the angle in FIG. 64.

In accordance with the present invention, composite arrays of microlenses (and related composite arrays of pixels) can be constructed and utilized to accomplish a variety of specific functions.

FIGS. 66 and 67 show how composite arrays are constructed to achieve a foveal function quite similar to the foveal vision of the human eye.

Optics and mechanical and electronic components can be readily associated with these composite arrays to enhance imaging and also to provide additional imaging functions and analysis.

The outer peripheral arrays of low resolution (wideband) non-dispersive microlenses 121 (FIG. 67) and associated pixels 126 (FIG. 66) thus provide peripheral vision which can be utilized effectively for detecting motion; and the high resolution, multicolor, central arrays of dispersive microlenses 119 and associated pixels 123 provide a color sensitive vision which enable even more sensitive and complex imaging to be accomplished.

A composite pixel array like that shown in FIG. 66 also provides room, in the areas of the low resolution wideband pixels, for leading out the high density of signal lines which are associated with the inner, high resolution, multicolor pixel array.

The use of the dispersive microlens of the present invention as thus far described has been directed primarily to color detecting uses in environments in which the dispersive microlens have been used in a color detecting mode for detecting multiple different wavelengths or wavebands (by detectors located in a detector plane) from a bandwidth of wavelengths existing within an image plane blur spot at the microlens.

The dispersive microlens of the present invention can be used in another, color combining mode for combining a plurality of different, emitted wavelengths (emitted from emitters in an emitter plane) into a bandwidth of wavelengths (at a blur spot existing at the microlens in an image plane) so as to enable color information not only to be dispersed and detected but also to be emitted and combined for color transmitting and regenerating methods and apparatus, such as, for example, color television, color recording, color facsimile, and color printing processes and apparatus.

This use of the dispersive microlens of the present invention in a color combining mode will now be described in more detail with reference FIGS. 68, 69 and 70.

As shown in FIGS. 68 and 69, three emitters 151A, 151B and 151C (each emitting a specified wavelength of color—red, green and blue) are arranged in alignment within an axially rotated, elongated blur spot 145 (see FIG. 69) in a pixel 123 in the pixel plane and are associated with a related, same rotation angle of dispersive grating, microlens 119 in an image plane. The three separate emitters 151A, 151B and 151C emit respective blue, green and red wavelengths or wavebands of light, and these emitted wavelengths or wavebands are combined into a blur spot (indicated diagrammatically by the dashed outline 145 in FIG. 69) existing at the location of the dispersive microlens 119 in the image plane.

The color content and the intensity in the bandwidth of light in the blur spot 145 are dependent upon the relative intensities of the different wavelengths emitted by the three emitters 151A, 151B and 151C. The energizations of these emitters are modulated to produce the exact color and intensity desired at the specific location of the blur spot 145. By combining an array of the dispersive microlenses and associated array of the pixels containing the multiple emitters, a color screen (composed of an array of dispersive microlenses) can be used as a color display for color television, color printing, color facsimile, etc.

This is better illustrated in FIG. 70.

The color system 152 in FIG. 70 illustrates a system which may be used for transmitting color facsimile and/or color television from one station to another by utilizing apparatus and methods which incorporate the dispersive microlens of the present invention.

As illustrated in FIG. 70 a color combining and generating station 153 is connected, by means of a conduit 155, to a color receiving and/or detecting station 157, where the color information may be used directly or may be detected and further processed.

For simplifying illustration, only a single dispersive microlens has been illustrated at each of the generating and receiving stations 153 and 157, but it will be appreciated that a plurality of dispersive microlenses are used in an array (in combination with a related array of emitter plane pixels/detector plane pixels, and associated components).

As illustrated in the top part of FIG. 70, the color generating station comprises a dispersive microlens 119 which is positioned above emitters 151A, 151B and 151C in the manner described above with reference to FIGS. 68 and 69.

The energization and modulation of each emitter is controlled by respective control lines 159A, 159B and 159C.

The waveband of color, as combined in the microlens 119, is displayed on a pixel 161A on an array 163A of such pixels.

The combined color information contained in the pixel 161A is transmitted by a connector 165A to a transmitter 167A. The transmitter may transmit the information by fiber optics or may convert the information to electrical form for sending to the receiver station 157.

A component 169 may be used to serve a repeater function, or a switching function or a conversion function, depending upon the specific application.

At the receiver station 157, the operations performed on the operation received on the line 155 are substantially the reverse of the operations performed at the generating station 153.

The color information (as initially generated by the individual emitter plane pixels 123) is distributed back to corresponding, individual detector plane pixels 123.

Thus, the portion of the color information (as combined in the dispersive microlens 119 at the color combining station 153) is transmitted by the connector 165B and the screen pixel 161B to the related dispersive microlens 119 in the receiver station 157, where the bandwidth of information in that blur spot is dispersed to the separate detectors 124A, 124B and 124C.

The information in these particular wavelengths or wavebands can then be supplied (by respective connectors 126A, 126B and 126C) to a processor for further image processing or other use if desired.

It should also be noted that the color information developed and received on the screens 163A and 163B, or the information developed on the microlenses 119 in the color combining and generating station 153, can, for some purposes, be used directly without further processing.

This information, for example, can be used directly if it is desired only to view the image and color developed on the screen.

The organized pattern of color information as detected by the detectors 123 at the color receiving and/or detecting station 157 (as generated by an input other than an input from the station 153) may be sent from the station 157 to the color combining and generating station 153 by means of the transmitter 171B, the line or bus 173, the component 175, and the transmitter 171A, all as illustrated in FIG. 70.

While I have illustrated and described the preferred embodiments of my invention, it is to be understood that these are capable of variation and modification, and I therefore do not wish to be limited to the precise details set forth, but desire to avail myself of such changes and alterations as fall within the purview of the following claims.

I claim:

1. A unitary, dispersive microlens apparatus for use in dispersing a bandwidth of light into multiple selected wavelengths or wavebands of light at specified locations in an elongated blur spot so that detectors in the specified locations can detect the multiple wavelengths or wavebands, said microlens apparatus having height dimensions in the order of a few micrometers, said microlens comprising, a microlens constructed to transmit and to concentrate a selected bandwidth of light existing in a blur spot at the microlens to a smaller blur spot in a detector plane spaced at a selected distance from the microlens, and dispersion means for producing both a dispersion of the bandwidth of light as the light is transmitted and concentrated to the smaller blur spot and also an elongated shape of the smaller blur spot in which the wavelengths or wavebands are varied from one end of the elongated blur spot to the other so that more than one wavelength can be detected by detectors at specified locations within the elongated blur spot in the detector plane, said dispersive means comprising a grating formed integrally on the microlens and wherein the unitary construction of the grating integrally on the microlens enables one unitary, dispersive microlens apparatus to perform multiple, designed, refraction and dispersion functions while eliminating noise and reflection losses which could otherwise occur across an interface between a separated, non-unitary microlens and grating.

2. The invention defined in claim 1 wherein the dispersion means comprise a blazed grating formed integrally on the microlens.

3. A unitary, dispersive bidirectional microlens apparatus which can be used in a first mode, in which first mode light is transmitted through the microlens apparatus in a first direction, for detecting multiple different wavelengths from a bandwidth of the wavelengths existing within the microlens apparatus at an image plane blur spot and which can be used in a second mode, in which second mode light is transmitted through the microlens apparatus in a second direction opposite to said first direction, for combining a plurality of different, emitted wavelengths into a bandwidth of the wavelengths within the microlens apparatus, said dispersive microlens apparatus comprising, a microlens constructed to be positioned in an image plane at an image plane blur spot and to transmit and to concentrate a selected bandwidth of light from the image plane blur spot into a smaller detector/emitter plane blur spot in a detector/emitter plane which is spaced from the image plane, and dispersion means for producing, in relation to the bandwidth of light in the image plane blur spot, a dispersion of the bandwidth of light and an elongated detector/emitter plane blur spot in which the wavelengths are varied and dispersed to specified locations from one end to the other of the smaller, elongated blur spot so that, in said first mode, more than one wavelength and/or bands of wavelengths can be detected by detectors at the specified locations within the elongated blur spot when light is transmitted from the image plane to the detector plane and so that, in said second mode, a plurality of specified wavelengths of light can be emitted from a plurality of specified locations in the elongated blur spot and can be combined into a bandwidth of light in the image plane blur spot when light is transmitted from the emitter plane to the image plane, said dispersion means comprising a grating formed integrally on the microlens and wherein the unitary construction of the grating integrally on the microlens enables one unitary, dispersive microlens apparatus to perform multiple, designed, refraction and dispersion functions while eliminating noise and reflection losses which could otherwise occur across an interface between a separated, non-unitary microlens and grating.

4. The invention defined in claim 3 wherein the dispersion means comprise a blazed grating formed integrally on the microlens.

5. Apparatus for transmitting and concentrating optical information contained in optical blur spots in an image plane to small fractions of the areas of related pixels in a detector plane which is spaced from the image plane, said apparatus comprising, microlens means comprising a plurality of individual microlenses, positioned at a plurality of image plane blur spot locations, for transmitting and concentrating the optical information in an image plane blur spot into a smaller detector plane blur spot in a related pixel in the detector plane, so that the area of the detector plane blur spot is decoupled from the area of the pixel, and for producing a contrast ratio, fill factor and optical gain of said optical information in the detector plane blur spot with respect to any existing, unwanted noise present at the detector plane, at least certain ones of said individual microlenses including a grating formed integrally on the individual microlens for dispersing the optical information in at least certain ones of the image plane blur spots to create an elongation of a related detector plane blur spot and a dispersed distribution of the optical information to specific locations within that elongated blur spot which permits multiple, different signals to be detected by detectors at the specific locations within that elongated blur spot and wherein the unitary construction of the grating integrally on the microlens enables one unitary, dispersive microlens to perform multiple, designed, refraction and dispersion functions while eliminating noise and reflection losses which could otherwise occur across an interface between a separated, non-unitary microlens and grating.

6. The invention defined in claim 5 wherein the microlens means include an array of individual, dispersive microlenses and wherein the dispersion means comprise a blazed grating formed integrally and in a regular pattern on each individual, dispersive microlens.

7. The invention defined in claim 6 wherein the microlens means comprise circular shaped microlenses.

8. The invention defined in claim 6 wherein the microlens means comprise square shaped microlenses.

9. The invention defined in claim 6 wherein the microlens means comprise hexagonally shaped microlenses.

10. The invention defined in claim 6 wherein the microlens means comprise rhombic shaped microlenses.

11. The invention defined in claim 6 wherein the microlens means comprise non-Fresnel microlenses.

12. The invention defined in claim 6 wherein the microlens means comprise Fresnel microlenses.

13. The invention defined in claim 6 wherein the microlens means comprise microlenses which are non-Fresnel, non-binary microlens.

14. The invention defined in claim 6 wherein the microlens means comprise microlenses which are non-Fresnel binary microlenses.

15. The invention defined in claim 6 wherein the microlens means comprise microlenses which are non-Fresnel type lenses and which are analog microlenses.

16. The invention defined in claim 6 wherein the microlens means comprise microlenses which are Fresnel lenses and which are non-binary microlenses.

17. The invention defined in claim 6 wherein the microlens means comprise microlenses which are Fresnel lenses and which are binary microlenses.

18. The invention defined in claim 6 wherein the individual dispersive microlenses are arranged in rows in the array.

19. The invention defined in claim 5 including detector means for detecting multiple, different signals from the optical information in each elongated blur spot to thereby permit real time discrimination of the optical information for certain qualities, such as for example, the color and/or temperature, of the object or objects generating or reflecting the optical information.

20. The invention defined in claim 19 wherein the detector means include three detectors in each elongated blur spot for detecting high, medium and low color information.

21. The invention defined in claim 20 including electronic means for supplying the detected color information to a processor which uses the detected color information for color displays, such as color television, color recording, color facsimile, and color printing.

22. The invention defined in claim 19 wherein the detector means include multiple, individual detectors in each elongated blur spot for detecting multiple signals which can be summed in an acquisition mode to obtain an increased signal and which can be used in a discrimination mode to evaluate color contrast to determine object temperature and also to discriminate for temperature on the basis of the ratios of the detected energies.

23. The invention defined in claim 22 wherein the multiple, individual detectors provide signals which enable the use of a few spectral bands to suppress background and to enhance signal detectability.

24. The invention defined in claim 22 wherein two detectors looking at the same scene can be used to detect lack of registration between two objects.

25. The invention defined in claim 22 wherein the multiple, separate detectors can be selectively sized and positioned in the elongated blur spot pick up different, selected sets of information dependent on the sizes and positions of the detectors in the elongated blur spot.

26. The invention defined in claim 19 including analog circuit means for processing signals produced by the detector means.

27. The invention defined in claim 26 wherein the analog circuit means are used for combining the signals for enhanced signal-to-noise and/or for ratioing the signals as required.

28. The invention defined in claimed 27 wherein the analog circuit means for each detector means are placed next to the detector means on the otherwise unused portion of the area existing outside the respecitve detector/emitter plane blur spots.

29. Apparatus for transmitting and concentrating optical information contained in optical blur spots in an image plane to small fractions of the areas of related pixels in a detector plane which is spaced from the image plane, said apparatus comprising, microlens means, positioned at a plurality of image plane blur spot locations, for transmitting and concentrating the optical information in an image plane blur spot into a smaller detector plane blur spot in a related pixel in the detector plane, so that the area of the detector plane blur spot is decoupled from the area of the pixel, and for producing a contrast ratio, fill factor and optical gain of said optical information in the detector plane blur spot with respect to any existing, unwanted noise present at the detector plane, certain ones of said microlens means including dispersion means formed integrally on said microlens means for dispersing the optical information in at least certain ones of the image plane blur spots to create an elongation of a related detector plane blur spot and a distribution of the optical information within that elongated blur spot which permits multiple, different signals to be detected from within that elongated blur spot, and wherein the microlens means include wideband, non-dispersive microlenses in outer, peripheral portions of the image plane and the certain ones of the microlens means and integral dispersion means include high resolution, dispersive microlenses in the central portion of the image plane.

30. The invention defined in claim 29 wherein there is no dead, optically inactive zone between the microlenses in the microlens array and wherein the dispersive microlenses in the central portion of the image plane have a hexagonal configuration.

31. Apparatus for transmitting and concentrating optical information contained in optical blur spots in an image plane to small fractions of the areas of related pixels in a detector plane which is spaced from the image plane, said apparatus comprising, microlens means, positioned at a plurality of image plane blur spot locations, for transmitting and concentrating the optical information in an image plane blur spot into a smaller detector plane blur spot in a related pixel in the detector plane, so that the area of the detector plane blur spot is decoupled from the area of the pixel, and for producing a contrast ratio, fill factor and optical gain of said optical information in the detector plane blur spot with respect to any existing, unwanted noise present at the detector plane, said microlens means including dispersion means formed integrally on said microlens means for dispersing the optical information in at least certain ones of the image plane blur spots to create an elongation of a related detector plane blur spot and a distribution of the optical information within that elongated blur spot which permits multiple, different signals to be detected from within that elongated blur spot, said microlens means including an array of individual, dispersive microlenses and wherein the dispersion means comprise a blazed grating formed integrally and in a regular pattern on each individual, dispersive microlens, and wherein the individual dispersive microlenses are arranged in rows in the array, and wherein the grating pattern of each individual, dispersive microlens in a particular row is rotated at an angle with respect to the axis of that row to reduce optical cross talk noise between adjacent pixels in the detector plane.

32. The invention defined in claim 31 wherein the individual, dispersive microlenses in adjacent rows are longitudinally offset from one another to reduce optical cross talk noise between adjacent pixels in the detector plane.

33. Apparatus for transmitting and concentrating optical information contained in optical blur spots in an image plane to small fractions of the areas of related pixels in a detector plane which is spaced from the image plane, said apparatus comprising, microlens means, positioned at a plurality of image plane blur spot locations, for transmitting and concentrating the optical information in an image plane blur spot into a smaller detector plane blur spot in a related pixel in the detector plane, so that the area of the detector plane blur spot is decoupled from the area of the pixel, and for producing a contrast ratio, fill factor and optical gain of said optical information in the detector plane blur spot with respect to any existing, unwanted noise present at the detector plane, said microlens means including dispersion means formed integrally on said microlens means for dispersing the optical information in at least certain ones of the image plane blur spots to create an elongation of a related detector plane blur spot and a distribution of the optical information within that elongated blur spot which permits multiple, different signals to be detected from within that elongated blur spot, said microlens means including an array of individual, dispersive microlenses and wherein the dispersion means comprise a blazed grating formed integrally and in a regular pattern on each individual, dispersive microlens, and wherein the individual dispersive microlenses are arranged in rows in the array, and wherein the individual, dispersive microlenses in adjacent rows are longitudinally offset from one another to reduce optical cross talk noise between adjacent pixels in the detector plane.

34. Wavelength combining apparatus for combining a plurality of different emitted wavelengths of light, emitted from a plurality of emitters within an emitter plane blur spot, into a bandwidth of light within a unitary, dispersive microlens apparatus, said wavelength combining apparatus comprising, emitter means in an emitter plane blur spot for emitting a plurality of separate wavelengths or wavebands of light to be combined into a bandwidth of light within a unitary, dispersive microlens apparatus, unitary, dispersive microlens apparatus positioned at a distance from the emitter plane which is effective to permit the unitary, dispersive microlens apparatus to receive the light from the emitter means and to form the light into the bandwidth of light at the location of the microlens apparatus, said microlens apparatus including a microlens and a grating formed integrally on said microlens for combining all of the separate emitted wavelengths or wavebands into a single bandwidth of light so that the multicolor emitted wavelengths appear as a single composite color at the surface of the unitary, dispersive microlens apparatus, and wherein the unitary construction of the grating integrally on the microlens enables one unitary, dispersive microlens apparatus to perform multiple, designed, refraction and dispersion functions while eliminating noise and reflection losses which could otherwise occur across an interface between a separated, non-unitary microlens and grating.

35. The invention defined in claim 34 wherein said emitter plane blur spot is an elongated blur spot so related to the dispersion means that the wavelengths of emitted light can be varied from one end of the elongated blur spot to the other end.

36. The invention defined in claim 36 wherein the emitter means include a plurality of emitters within the elongated blur spot with each emitter generating a selected wavelength and/or band of wavelengths which is unique to that emitter and which is within said certain bandwidth and with each emitter positioned in the elongated blur spot at a location correlated to the wavelength emitted by that emitter.

37. The invention defined in claim 36 including energizing means for energizing the emitters to beam light at the selected wavelengths from the emitters to the dispersive microlens apparatus.

38. The invention defined in claim 37 wherein the energizing means include modulating means for modulating the output of the emitters and for thereby controlling the wavelengths present in said bandwidth at the image plane blur spot and also the relative energy levels of the different wavelengths which are present in said bandwidth at the image plane blur spot.

39. Apparatus for combining a plurality of different emitted wavelengths of light, emitted from a plurality of emitters within an emitter plane blur spot, into a bandwidth of light at an image plane blur spot, said apparatus comprising, emitter means in an emitter plane blur spot for emitting a plurality of separate wavelengths or wavebands of light to be combined into a bandwidth of light at an image plane blur spot, microlens means positioned at an image plane at a distance from the emitter plane which is effective to permit the microlens means to receive the light from the emitter means and to form the light into an image plane blur spot at the location of the microlens means, said microlens means including dispersion means formed integrally on said microlens means for combining all of the separate, emitted wavelengths or wavebands into a single bandwidth of light in the image plane blur spot so that the multicolor emitted wavelengths appear as a single composite color at the surface of the microlens means, and wherein said emitter plane blur spot is an elongated blur spot so related to the dispersion means that the wavelengths of emitted light can be varied from one end of the elongated blur spot to the other end, and wherein the emitter means include a plurality of emitters within the elongated blur spot with each emitter generating a selected wavelength and/or band of wavelengths which is unique to that emitter and which is within said certain bandwidth and with each emitter positioned in the elongated blur spot at a location correlated to the wavelength emitted by that emitter, and including energizing means for energizing the emitters to beam light at the selected wavelengths from the emitters to the dispersive microlens means, and wherein the energizing means include modulating means for modulating the output of the emitters and for thereby controlling the wavelengths present in said bandwidth at the image plane blur spot and also the relative energy levels of the different wavelengths which are present in said bandwidth at the image plane blur spot, and wherein the emitters include three emitters for emitting red, green and blue color information.

40. The invention defined in claim 39 including processing means for using the color information as combined in the image plane blur spot for color transmitting and regenerating apparatus, such as color television, color recording, color facsimile, and color printing.

41. Apparatus for processing color information using at least two separate arrays of dispersion microlenses, said apparatus comprising, (a) color generating and combining means for generating an organized pattern of color information made up from a plurality of individual, image plane blur spots, said color generating and combining means comprising, an emitter plane having a plurality of individual, emitter plane blur spots, emitter means in each emitter plane blur spot for emitting a plurality of separate wavelengths or wavebands of light to be combined into a bandwidth of light at a related image plane blur spot, first microlens means comprising a first array of individual microlenses positioned at an image plane at a distance from the emitter plane which is effective to permit each individual microlens to receive the light from the emitter means in a related emitter plane blur spot and to form the light into an image plane blur spot at the location of the individual microlenses, said first microlens means including dispersion means formed integrally on each individual microlens for combining all of the separate, emitted wavelengths or wavebands, emitted from a related emitter plane blur spot, into a single bandwidth of light in the image plane blur spot so that the multicolor, emitted wavelengths appear as a single composite color at the surface of the individual microlenses, (b) color dispersing and detecting means for detecting component wavelengths or wavebands of color contained within individual bandwidths of color in individual, image plane blur spots, which image plane blur spots collectively make up an organized pattern of color information, said color dispersing and detecting means comprising, an image plane having a plurality of individual, image plane blur spots, a detector plane having a plurality of individual pixels with each pixel having a small but elongated pixel blur spot area, second microlens means comprising a second array of individual microlenses with each individual microlens positioned at a related, individual, image plane blur spot, said second microlens means including dispersion means formed integrally on each individual microlens for dispersing the bandwidth of color in the related image plane blur spot to a related pixel blur spot area and for producing an elongated pixel blur spot in which the wavelengths are varied from one end to the other, and detector means in each pixel blur spot for detecting multiple, different colors from the elongated pixel blur spot, and (c) transmitting means for transmitting the organized pattern of color information bidirectionally between the color generating and combining means and the color dispersing and detecting means.

42. A method of transmitting and concentrating optical information contained in optical blur spots in an image plane to small fractions of the areas of related pixels in a detector plane which is spaced from the image plane, said method comprising, positioning a microlens at an image plane blur spot for transmitting and concentrating the optical information in the image plane blur spot into a smaller detector plane blur spot in a related pixel in the detector plane, so that the area of the detector plane blur spot is decoupled from the area of the pixel, and for producing a contrast ratio, fill factor and optical gain of said optical information in the detector plane blur spot with respect to any existing, unwanted noise present at the detector plane, dispersing the optical information in the image plane blur spot through a related microlens having a dispersion producing diffraction grating formed integrally on the microlens which is effective to create an elongation of a related detector plane blur spot and a dispersed distribution of the optical information to specific locations within that elongated, detector plane blur spot and which distribution of the optical information permits multiple, different signals to be detected by detectors at the specific locations within that elongated, detector plane blur spot, and detecting multiple, different signals at the specific locations from the optical information in the elongated, detector plane blur spot to thereby permit real time discrimination of the optical information for certain qualities, such as, for example, the color and/or temperature, of the object or objects generating the optical information, and wherein the unitary construction of the grating integrally on the microlens enables one unitary, dispersive microlens to perform multiple, designed, refraction and dispersion functions while eliminating noise and reflection losses which could otherwise occur across an interface between a separated, non-unitary microlens and grating.

43. A method of combining a plurality of different emitted wavelengths of light, emitted from a plurality of emitters within an emitter plane blur spot, into a bandwidth of light at an image plane blur spot, said method comprising, emitting from a plurality of specific locations in an elongated emitter plane blur spot a plurality of separate wavelengths or wavebands of light to be combined into a bandwidth of light within a unitary dispersive microlens apparatus, positioning a unitary dispersive microlens apparatus comprising a microlens and a grating formed integrally on the microlens at an image plane at a distance from the emitter plane which is effective to permit the unitary microlens apparatus to receive the light emitted from the emitter plane blur spot and to form the light into an image plane blur spot at the location of the unitary microlens apparatus, combining all of the separate, emitted wavelengths or wavebands into a single bandwidth of light in the image plane blur spot by the grating formed integral on the microlens and so related to locations of the emitted wavelengths or wavebands in the elongated emitter plane blur spot that the multicolor emitted wavelengths appear as a single composite color at the surface of the unitary dispersive microlens apparatus.

* * * * *